US011480867B2

United States Patent
Ikebe et al.

(10) Patent No.: US 11,480,867 B2
(45) Date of Patent: Oct. 25, 2022

(54) REFLECTIVE MASK BLANK, REFLECTIVE MASK AND METHOD OF MANUFACTURING SEMICONDUCTOR DEVICE

(71) Applicant: HOYA CORPORATION, Tokyo (JP)

(72) Inventors: Yohei Ikebe, Tokyo (JP); Tsutomu Shoki, Tokyo (JP); Takahiro Onoue, Tokyo (JP); Hirofumi Kozakai, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 0 days.

(21) Appl. No.: 17/227,655

(22) Filed: Apr. 12, 2021

(65) Prior Publication Data

US 2021/0255536 A1    Aug. 19, 2021

Related U.S. Application Data

(63) Continuation of application No. 16/490,018, filed as application No. PCT/JP2018/006054 on Feb. 20, 2018, now Pat. No. 11,003,068.

(30) Foreign Application Priority Data

Mar. 3, 2017  (JP) .................................. 2017-040043
May 31, 2017  (JP) .................................. 2017-107394

(51) Int. Cl.
*G03F 1/24* (2012.01)
*G03F 1/26* (2012.01)

(52) U.S. Cl.
CPC . *G03F 1/24* (2013.01); *G03F 1/26* (2013.01)

(58) Field of Classification Search
CPC .................................... G03F 1/24; G03F 1/26
USPC .......................................................... 430/5
See application file for complete search history.

(56) References Cited

U.S. PATENT DOCUMENTS

| | | | |
|---|---|---|---|
| 5,641,593 A | 6/1997 | Watanabe et al. | |
| 9,864,267 B2 | 1/2018 | Ikebe et al. | |
| 10,871,707 B2 | 12/2020 | Ikebe | |
| 2005/0282072 A1 | 12/2005 | Hector et al. | |
| 2012/0107733 A1 | 5/2012 | Hayashi et al. | |
| 2013/0164660 A1 | 6/2013 | Hayashi | |
| 2016/0238925 A1 | 8/2016 | Hamamoto et al. | |
| 2017/0023856 A1 | 1/2017 | Okubo et al. | |
| 2017/0038673 A1 | 2/2017 | Ikebe et al. | |
| 2018/0329285 A1 | 11/2018 | Hamamoto et al. | |

FOREIGN PATENT DOCUMENTS

| | | | |
|---|---|---|---|
| JP | 07-114173 A | 5/1995 | |
| JP | 2002072443 A | 3/2002 | |
| JP | 2006-228766 A | 8/2006 | |
| JP | 2012018198 A | 1/2012 | |
| JP | 5233321 B | 7/2013 | |
| JP | 5266988 B | 8/2013 | |
| JP | 5716146 B1 | 3/2015 | |
| JP | 2015-122468 A | 7/2015 | |
| JP | 2015142083 A | 8/2015 | |
| TW | 201631378 A | 9/2016 | |
| WO | 2011004850 A1 | 1/2011 | |
| WO | 2012/026463 A1 | 3/2012 | |

OTHER PUBLICATIONS

JP2021054859, "Office Action with Machine Translation", dated Dec. 21, 2021, 10 pages.
TW107106939, "Office Action", dated Nov. 19, 2021, 11 pages.
JP2017-107394, "Notice of Reasons for Refusal" with machine translation, dated Oct. 13, 2020, 10 pages.
PCT/JP2018/006054, English translation of International Search Report dated May 15, 2018.
SG11201907623R, "Invitation to Respond to Written Opinion", dated Jun. 2, 2020, 7 pages.
U.S. Appl. No. 16/490,018, "Notice of Allowance" dated Jan. 19, 2021, 9 pages.
U.S. Appl. No. 16/490,018, "Corrected Notice of Allowability" dated Feb. 12, 2021, 2 pages.
JP2021-054859, "Notice of Reasons for Refusal" with Machine Translation, dated Aug. 16, 2022, 6 pages.

*Primary Examiner* — Christopher G Young
(74) *Attorney, Agent, or Firm* — Kilpatrick Townsend & Stockton LLP

(57) ABSTRACT

Provided are a reflective mask blank, having a phase shift film having little dependence of phase difference and reflectance on film thickness, and a reflective mask. The reflective mask blank is characterized in that the phase shift film is composed of a material comprised of an alloy having two or more types of metal so that reflectance of the surface of the phase shift film is more than 3% to not more than 20% and so as to have a phase difference of 170 degrees to 190 degrees, and when a group of metal elements that satisfies the refractive index n and the extinction coefficient k of $k>\alpha*n+\beta$ is defined as Group A and a group of metal elements that satisfies the refractive index n and the extinction coefficient k of $k<\alpha*n+\beta$ is defined as Group B, the alloy is such that the composition ratio is adjusted so that the amount of change in the phase difference is within the range of ±2 degrees and the amount of change in reflectance is within the range of ±0.2% when one or more types of metal element each is selected from the Group A and the Group B and the film thickness of the phase shift film has fluctuated by ±0.5% with respect to a set film thickness (provided that $\alpha$: proportional constant, $\beta$: constant).

21 Claims, 6 Drawing Sheets

REFLECTIVE MASK BLANK, REFLECTIVE MASK AND METHOD OF MANUFACTURING SEMICONDUCTOR DEVICE

CROSS REFERENCE TO RELATED APPLICATIONS

This application is a continuation application of U.S. application Ser. No. 16/490,018, filed Aug. 29, 2019, which is the U.S. National Phase application of International Application No. PCT/JP2018/006054, filed Feb. 20, 2018, which claims priority to Japanese Application No. 2017-040043, filed Mar. 3, 2017, and Japanese Application No. 2017-107394, filed on May 31, 2017, and the contents of which is hereby incorporated by reference herein in its entirety.

TECHNICAL FIELD

The present disclosure relates to a reflective mask blank and reflective mask serving as master plates for manufacturing exposure masks used, for example, in the manufacturing of semiconductor devices, and to a method of manufacturing a semiconductor device that uses the reflective mask.

BACKGROUND ART

The types of light sources of exposure apparatuses used in the manufacturing of semiconductor devices are evolving while gradually using shorter wavelengths, as is indicated by the g-line having a wavelength of 436 nm, i-line having a wavelength of 365 nm, KrF lasers having a wavelength of 248 nm and ArF lasers having a wavelength of 193 nm. EUV lithography using extreme ultraviolet (EUV) light having a light source wavelength in the vicinity of 13.5 nm has been proposed in order to realize transfer of even finer patterns. In EUV lithography, a reflective mask is used due to the small differences in absorptance between materials with respect to EUV light. A configuration has been proposed for the reflective masks in which, for example, a multilayer reflective film that reflects exposure light is formed on a substrate, and a phase shift film that absorbs exposure light is formed in the shape of a pattern on a protective film for protecting the multilayer reflective film. Light that has entered the reflective mask installed in an exposure apparatus (pattern transfer apparatus) is absorbed at those portions where the phase shift film pattern is present and is reflected by the multilayer reflective film at those portions where the phase shift film pattern is not present. As a result, an optical image corresponding to the mask pattern is transferred to the semiconductor substrate through reflective optics. A portion of the exposure light entering the phase shift film pattern is reflected (phase-shifted) at a phase difference of about 180 degrees from light reflected by the multilayer reflective film. As a result, contrast (resolution) can be obtained.

Technologies relating these reflective masks for EUV lithography and mask blanks for the manufacturing thereof are disclosed in Patent Documents 1 to 3.

Patent Document 1 describes that a material of a halftone film (phase shift film) comprised of a single layer film is selected from the region indicated within the square shown in FIG. 2 depicting planar coordinates obtained by plotting refractive index n on the vertical axis and extinction coefficient k on the horizontal axis. TaMo (composition ratio: 1:1) is described as a specific example of a material of the single layer film.

Patent Document 2 describes that a compound of Ta and Ru, having a high degree of freedom of reflectance selectivity and high cleaning resistance, is used for the material of a halftone film in order to reduce the shadowing effect in a halftone EUV mask, and defines the composition range thereof.

Patent Document 3 describes that a material of a halftone film, having a high degree of freedom of reflectance selectivity and high cleaning resistance, contains Ta and Nb and that the composition ratio of Ta:Nb is within the composition range of about 4:1 to about 1:2 in order to enhance etching accuracy.

Here, the shadowing effect refers to the following type of phenomenon. In an exposure apparatus using a reflective mask, for example, light is made to enter at a slight angle from the perpendicular direction relative to the mask so that the optical axes of the incident light and reflected light do not overlap. A shadow based on the thickness of the phase shift film pattern forms attributable to the inclination of the incident direction of the light when the phase shift film pattern of the mask has a certain thickness. The dimensions of the transfer pattern change corresponding to the portion of this shadow thereby resulting in the shadowing effect.

PRIOR ART DOCUMENTS

Patent Documents

Patent Document 1: JP 2006-228766 A
Patent Document 2: JP 5233321 B
Patent Document 3: JP 5266988 B

DISCLOSURE OF THE INVENTION

Problems to be Solved by the Disclosure

The phase shift films of reflective masks are designed so that reflectance at the phase shift film pattern is 3% to 20% in order to improve resolution attributable to the phase shift effect. Here, reflectance of the phase shift film pattern refers to reflectance of EUV light reflected from the phase shift film pattern based on a value of 100% for reflectance of EUV light reflected from a multilayer reflective film (including a multilayer reflective film with protective film) at those portions where the phase shift film pattern is absent.

In addition, the phase difference between a portion of EUV light entering the phase shift film pattern that is reflected by the multilayer reflected film and EUV light reflected by the multilayer reflected film at those portions where the phase shift film layer is not present is designed to be about 180 degrees.

On the other hand, variations in phase difference in the phase shift films provided between a plurality of reflective mask blanks are required to be within the range of a prescribed phase difference variation (for example, ±2 degrees) with respect to a prescribed reflectance of the phase shift film in order to manufacture a phase shift effect and prevent pattern errors in the transfer pattern transferred using the reflective mask blank. In addition, in addition to phase difference variation, reflective mask blanks are required to restrict reflectance variation to within a prescribed reflectance variation (for example, ±0.2%) with respect to a prescribed reflectance of the phase shift film (for example, 6%).

However, fluctuations in the film thickness of the phase shift film when manufacturing multiple reflective mask blanks cannot be avoided. Consequently, it is difficult to stably manufacture reflective mask blanks having a desired phase difference property (for example, phase shift variation within the range of ±2 degrees) with respect to a prescribed phase difference (for example, 180 degrees). In addition, in addition to phase difference properties, it is even more difficult to obtain reflective mask blanks having a desired reflectance property (for example, reflectance variation within the range of ±0.2%) with respect to a prescribed reflectance (for example, 6%).

Therefore, an aspect of the present disclosure is to provide a reflective mask blank that enables stable manufacturing of a reflective mask having a desired phase difference property and a desired reflectance property, even if the film thickness of the phase shift film has fluctuated to some degree from the design value, when continuously manufacturing multiple reflective mask blanks.

Means for Solving the Problems

The inventors of the present disclosure discovered the optimum conditions for obtaining a desired phase difference property (for example, phase difference variation among multiple reflective mask blanks within the range of 180 degrees±2 degrees) and a desired reflectance property (for example, reflectance variation among multiple reflective mask blanks within the range of 6%±0.2%) even if the film thickness of the phase shift film has fluctuated to some degree (for example, fluctuations within the range of ±0.5% with respect to the designed film thickness) when continuously manufacturing multiple reflective mask blanks. In addition, the inventors of the present disclosure found that spot-like presence of the refractive index and extinction coefficient of the phase shift film composing the reflective mask blank is also an optimum condition, thereby leading to completion of the present disclosure.

The present disclosure has the following configurations in order to solve the aforementioned problems. The present disclosure consists of a reflective mask blank of the following Configurations 1 to 10, a reflective mask of the following Configuration 11, and a method of manufacturing a semiconductor device of the following Configuration 12.

(Configuration 1)

A reflective mask blank provided with a multilayer reflective film formed on a substrate and a phase shift film formed on the multilayer reflective film, wherein:

the phase shift film is composed of a material comprised of an alloy having two or more types of metal so that reflectance of the surface of the phase shift film to EUV light with respect to light reflected from the multilayer film prior to forming the phase shift film is more than 3% to less than 20% and so as to have a phase difference of 170 degrees to 190 degrees, and when the refractive index at the wavelength of the EUV light is defined as n and the extinction coefficient is defined as k, and a group of metal elements that satisfies the refractive index n and the extinction coefficient k of the following formula (1) is defined as Group A, and a group of metal elements that satisfies the refractive index n and the extinction coefficient k of the following formula (2) is defined as Group B, the alloy is such that the composition ratio is adjusted so that the amount of change in the phase difference is within the range of ±2 degrees and the amount of change in reflectance is within the range of ±0.2% when one or more types of metal element each is selected from the Group A and the Group B and the film thickness of the phase shift film has fluctuated by ±0.5% with respect to a set film thickness:

$$k > \alpha * n + \beta \quad \text{Formula (1)}$$

$$k < \alpha * n + \beta \quad \text{Formula (2)}$$

(wherein, α: proportional constant, β: constant).

According to Configuration 1 of the present disclosure, a reflective mask blank can be provided that enables stable manufacturing of a reflective mask blank having a desired phase difference property and a desired reflectance property even if the film thickness of a phase shift film has fluctuated somewhat with respect to a set film thickness when continuously manufacturing multiple reflective mask blanks.

(Configuration 2)

Configuration 2 of the present disclosure is the reflective mask blank described in Configuration 1, wherein reflectance of the surface of the phase shift film with respect to EUV light is more than 5% and not more than 10%, and the value of α in the Formula (1) and the Formula (2) is −0.303 and the value of β is 0.309.

According to Configuration 2 of the present disclosure, a reflective mask blank can be provided that enables stable manufacturing of a reflective mask blank having a desired phase difference property and a desired reflectance property even if the film thickness of a phase shift film has fluctuated somewhat with respect to a set film thickness when continuously manufacturing multiple reflective mask blanks in which reflectance of the surface of the phase shift film with respect to EUV light is more than 5% and not more than 10%.

(Configuration 3)

Configuration 3 of the present disclosure is the reflective mask blank described in Configuration 1, wherein reflectance of the surface of the phase shift film with respect to EUV light is more than 3% and not more than 5%, and the value of α in the Formula (1) and the Formula (2) is −0.331 and the value of β is 0.339.

According to Configuration 3 of the present disclosure, a reflective mask blank can be provided that enables stable manufacturing of a reflective mask blank having a desired phase difference property and a desired reflectance property even if the film thickness of a phase shift film has fluctuated somewhat with respect to a set film thickness when continuously manufacturing multiple reflective mask blanks in which reflectance of the surface of the phase shift film with respect to EUV light is more than 3% and not more than 5%.

(Configuration 4)

Configuration 4 of the present disclosure is the reflective mask blank described in Configuration 1, wherein reflectance of the surface of the phase shift film with respect to EUV light is more than 10% and not more than 20%, and the value of α in the Formula (1) and the Formula (2) is −0.192 and the value of β is 0.194.

According to Configuration 4 of the present disclosure, a reflective mask blank can be provided that enables stable manufacturing of a reflective mask blank having a desired phase difference property and a desired reflectance property even if the film thickness of a phase shift film has fluctuated somewhat with respect to a set film thickness when continuously manufacturing multiple reflective mask blanks in which reflectance of the surface of the phase shift film with respect to EUV light is more than 10% and not more than 20%.

(Configuration 5)

A reflective mask blank provided with a multilayer reflective film formed on a substrate and a phase shift film formed on the multilayer reflective film, wherein the phase shift film is composed of a material comprising an alloy having two or more types of metals so that reflectance $R_0$ of EUV light on the surface of the phase shift film with respect to exposure light from the multilayer reflective film prior to forming the phase shift film is 4%, 6% or 12% and phase difference $θ0$ is 180 degrees, and the alloy is such that the alloy has a refractive index n and an extinction coefficient k at the wavelength of EUV light and the composition ratio is adjusted so that the tolerance of a phase difference θ is $θ_0$-5 degrees≤θ≤$θ_0$+5 degrees and the tolerance of a reflectance R is 0.9 $R_0$≤R≤1.1$R_0$ when film thickness of the phase shift film has fluctuated by ±0.5% with respect to a set film thickness.

According to Configuration 5 of the present disclosure, a reflective mask blank can be provided that enables stable manufacturing of a reflective mask blank having a desired phase difference property and a desired reflectance property even if the film thickness of a phase shift film has fluctuated somewhat with respect to a set film thickness when continuously manufacturing multiple reflective mask blanks.

(Configuration 6)

Configuration 6 of the present disclosure is the reflective mask blank described in Configuration 5, wherein the alloy has a reflectance contained within the range of 0.877 to 0.881 and an extinction coefficient contained within the range of 0.046 to 0.052.

(Configuration 7)

Configuration 7 of the present disclosure is the reflective mask blank described in Configuration 5, wherein the alloy has a reflectance contained within the range of 0.901 to 0.907 and an extinction coefficient contained within the range of 0.035 to 0.041.

The reflective mask blank of Configuration 6 or Configuration 7 of the present disclosure allows a phase shift film to be easily obtained that has a high degree of freedom of reflectance capable of accommodating a plurality of reflectance values simply by changing film thickness by employing a configuration in which reflectance and extinction coefficient are contained within prescribed ranges.

(Configuration 8)

Configuration 8 of the present disclosure is the reflective mask blank described in any one of Configurations 1 to 7, wherein the alloy is a multi-element alloy containing three or more metal elements.

The reflective mask blank of Configuration 8 of the present disclosure allows a phase shift film to be easily obtained that is provide with an optical refractive index and extinction coefficient for achieving a desired phase different property and a desired reflectance property by using a multi-element alloy containing three or more metal elements for the phase shift film.

(Configuration 9)

Configuration 9 of the present disclosure is the reflective mask blank described in any one of Configurations 1 to 8, wherein the film thickness of the phase shift film is not less than 25 nm and not more than 70 nm.

The reflective mask blank of Configuration 9 of the present disclosure is able to reduce the shadowing effect by making the film thickness of the phase shift film to be not less than 25 nm and not more than 70 nm.

(Configuration 10)

Configuration 10 of the present disclosure is the reflective mask blank described in any one of Configurations 1 to 9, wherein the uppermost layer of the multilayer reflective film on the side of the phase shift film is provided with a protective film.

The reflective mask blank of Configuration 10 of the present disclosure is able to inhibit damage to the surface of the multilayer reflective film when manufacturing a reflective mask using the reflective mask blank by providing a protective film on the uppermost layer of the multilayer reflective film on the side of the phase shift film.

(Configuration 11)

Configuration 11 of the present disclosure is a reflective mask having a phase shift film pattern obtained by patterning the phase shift film in the reflective mask blank described in any one of Configurations 1 to 10.

Since the reflective mask of Configuration 11 of the present disclosure is manufactured using the aforementioned reflective mask blank, a reflective mask can be obtained that has a phase shift film pattern having a desired phase difference property and a desired reflectance property.

(Configuration 12)

Configuration 12 of the present disclosure is a method of manufacturing a semiconductor device that includes a pattern formation step for forming a pattern on a semiconductor substrate using the reflective mask described in Configuration 11.

According to the method of manufacturing a semiconductor device of Configuration 12 of the present disclosure, since a reflective mask can be used that has a phase shift film pattern having a desired phase difference property and a desired reflectance property, a semiconductor device can be manufactured that has a fine and highly accurate transfer pattern.

Effects of the Disclosure

According to the present disclosure, a reflective mask blank can be stably provided that has a desired phase difference property and reflectance property even if the film thickness of a phase shift film has fluctuated somewhat with respect to a design value when continuously manufacturing multiple reflective mask blanks.

In addition, as a result of using the reflective mask blank of the present disclosure, a reflective mask can be obtained that has a phase shift film pattern having a desired phase difference property and reflectance property.

In addition, according to the method of manufacturing a semiconductor device of the present disclosure, since a reflective mask can be used that has a phase shift film pattern having a desired phase difference property and reflectance property, a semiconductor device can be manufactured that has a fine and highly accurate transfer pattern.

MODE FOR CARRYING OUT THE INVENTION

The following provides a detailed explanation of embodiments of the present disclosure with reference to the drawings. Furthermore, the following embodiments are configurations used when embodying the disclosure and do not limit the present disclosure to the scope thereof.

First Embodiment

Figure 1:
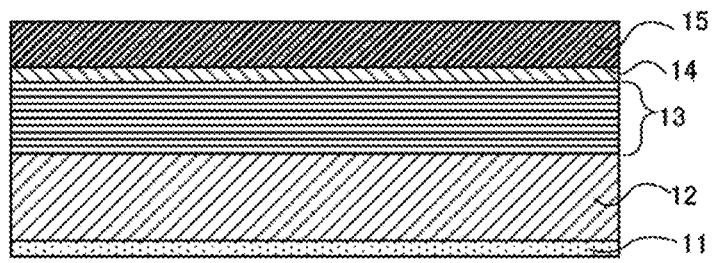
FIG. 1 is a cross-sectional view for explaining the schematic configuration of a reflective mask blank for EUV lithography of an embodiment of the present disclosure.

FIG. 1 indicates a cross-sectional schematic diagram of a first embodiment of the present disclosure in the form of a reflective mask blank 10. The reflective mask blank 10 of the present embodiment has a multilayer reflective film 13 and a phase shift film 15 that shifts the phase of EUV light formed in that order on a substrate 12. Furthermore, the reflective mask blank 10 for EUV lithography having the configuration shown in FIG. 1 can also be used in the second and third embodiments of the present disclosure to be subsequently described.

The phase shift film 15 of the reflective mask blank 10 of the first embodiment of the present disclosure is composed of a material comprised of an alloy having two or more types of metals so that the reflectance of the surface of the phase shift film 15 with respect to EUV light (wavelength: 13.5 nm) is greater than 3% and less than 20% and so as to have a phase difference of 170 degrees to 190 degrees with respect to light reflected from the multilayer reflective film 13.

The alloy that composes the phase shift film 15 is selected so that the amounts of change in phase difference and reflectance with respect to a prescribed fluctuation in film thickness are within prescribed ranges. Namely, when refractive index at the wavelength of EUV light (13.5 nm) is defined as n and the extinction coefficient is defined as k, and a group of metal elements for which refractive index n and extinction coefficient k satisfy the following Formula (1) is defined as Group A, and a group of metal elements for which refractive index n and extinction coefficient k satisfy the following Formula (2) is defined as Group B, one or more types of metal element each from Group A and Group B is first selected for the alloy. The composition ratio of the metal element of Group A and the metal element of Group is adjusted so that the amount of change in phase difference is within the range of ±2 degrees and the amount of change in reflectance is within the range of ±0.2% when the film thickness of the phase shift film 15 has fluctuated by ±0.5% with respect to a set film thickness. Furthermore, a range of ±2 degrees for the amount of change in phase difference refers to a phase difference θ being indicated with a range of $\theta_0-2$ degrees$\leq\theta\leq\theta_0+2$ degrees when a desired phase difference is defined as $\theta_0$. In addition, a range of ±0.2% for the amount of change in reflectance refers to a reflectance R being indicated with a range of $R_0-0.2\%\leq R\leq R_0+0.2\%$ when a desired reflectance is defined as $R_0$. Furthermore, an asterisk (*) is used as a multiplication sign in the present description:

$$k>\alpha*n+\beta \qquad \text{Formula (1)}$$

$$k<\alpha*n+\beta \qquad \text{Formula (2)}$$

(wherein, α: proportional constant, β: constant).

Figure 2:
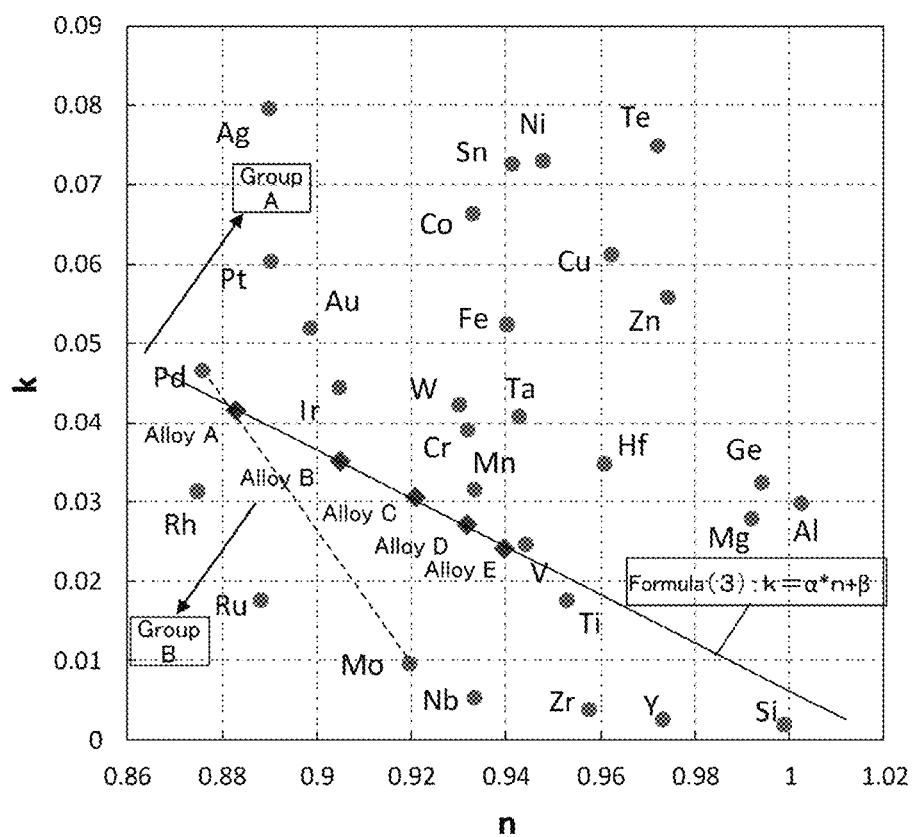
FIG. 2 is a graph for explaining a first embodiment of the present disclosure that indicates the properties of refractive index n and extinction coefficient k of a metal material in EUV light (wavelength: 13.5 nm).

FIG. 2 is a graph indicating the relationship between refractive index n and extinction coefficient k of a metal material in EUV light (wavelength: 13.5 nm).

The composition ratio of the alloy composing the phase shift film 15 of the present disclosure is adjusted in the following manner. First, α and β are suitably set corresponding to the reflectance of the surface of the phase shift film 15 with respect to EUV light. One or more types of metal element each is selected from the groups of metal elements that satisfy the relational expressions of the aforementioned Formulas (1) and (2) in the form of Group A and Group B. The composition ratio of the metal elements is adjusted so that the amount of change in phase difference is within the range of ±2 degrees and the amount of change in reflectance is within the range of ±0.2% when the film thickness of the phase shift film 15 has fluctuated by ±0.5%.

FIG. 2 is a graph obtained by plotting the refractive indices and extinction coefficients of multiple alloy materials (Alloy A, Alloy B, Alloy C, Alloy D and Alloy E) in which the amount of change in phase difference of the phase shift film 15 is within the range of ±2 degrees and the amount of change in reflectance is ±0.2% when the film thickness of the phase shift film 15 has fluctuated by ±0.5%. The following Formula (3) depicts an approximation line that passes through the multiple alloy materials (Alloy A, Alloy B, Alloy C, Alloy D and Alloy E).

$$k=\alpha*n+\beta \qquad \text{Formula (3)}$$

In FIG. 2, examples of metal elements belonging to Group A that satisfy Formula (1) ($k>\alpha*n+\beta$) include Pd, Ag, Pt, Au, Ir, W, Cr, Co, Mn, Sn, Ta, V, Ni, Hf, Fe, Cu, Te, Zn, Mg, Ge and Al. Examples of metal elements belonging to Group B that satisfy Formula (2) ($k<\alpha*n+\beta$) include Rh, Ru, Mo, Nb, Ti, Zr, Y and Si.

In the case of binary alloy, for example, Alloy A can be made to be a PdMo alloy (binary alloy) by selecting Pd that belongs to Group A and Mo that belongs to Group B. This PdMo alloy has a composition ratio of Alloy A that satisfies refractive index $n_A$ and extinction coefficient $k_A$.

In the case of using a material comprised of a multi-element alloy containing multiple metal elements for the phase shift film 15, Alloy A that satisfies refractive index $n_A$ and extinction coefficient $k_A$, Alloy B that satisfies refractive index $n_B$ and extinction coefficient $k_B$, Alloy C that satisfies refractive index $n_C$ and extinction coefficient $k_C$, or Alloy D that satisfies refractive index $n_D$ and extinction coefficient $k_D$ can be obtained by selecting multiple elements from Group A, selecting multiple elements from Group B, and adjusting the composition ratios of the alloys containing these selected elements.

Figure 3:
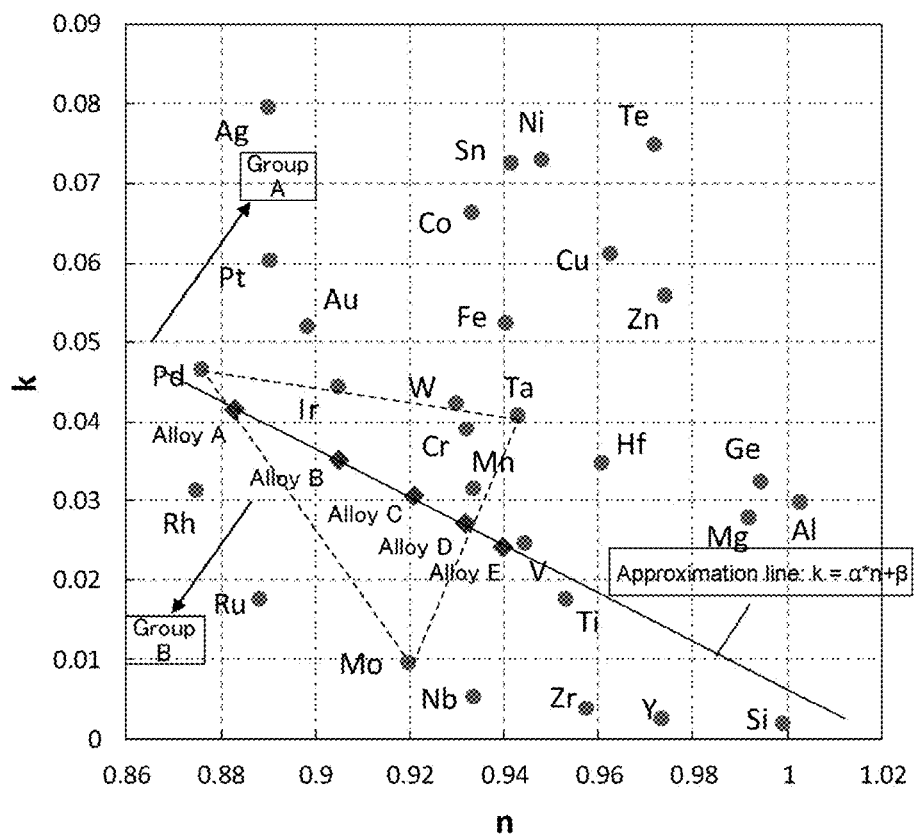
FIG. 3 is a graph for explaining a first embodiment of the present disclosure that indicates the properties of refractive index n and extinction coefficient k of a metal material in EUV light (wavelength: 13.5 nm).

FIG. 3 indicates the case of using a material comprised of ternary alloy as a multi-element alloy able to be used as a material of the phase shift film 15 of the present disclosure. A TaPdMo alloy (ternary alloy) can be obtained by selecting, for example, Pd and Ta belonging to Group A and Mo belonging to Group B to obtain a ternary alloy in which the amount of change in phase difference of the phase shift film 15 is within the range of ±2 degrees and the amount of change in reflectance is within the range of ±0.2% when the film thickness of the phase shift film 15 has fluctuated by ±0.5%. The TaPdMo alloy can be made to be the aforementioned Alloy A, Alloy B, Alloy C or Alloy D by adjusting the composition ratio thereof.

<Configuration and Manufacturing Method of Reflective Mask Blank 10>

FIG. 1 indicates a cross-sectional schematic diagram for explaining the configuration of the reflective mask blank 10 for EUV lithography of a first embodiment of the present disclosure. The following provides an explanation of the reflective mask blank 10 of the present disclosure using FIG. 1.

As shown in FIG. 1, the reflective mask blank 10 is provided with a substrate 12 having a back side conductive film 11, a multilayer reflective film 13, a protective film 14 and a phase shift film 15. The substrate 12 has the back side conductive film 11 for electrostatic chucking formed on a main surface on the back side of the substrate 12. The multilayer reflective film 13 is formed on a main surface of the substrate 12 (main surface on the opposite side from the side where the back side conductive film 11 has been formed) and reflects exposure light in the form of EUV light. The protective film 14 is formed on the uppermost layer of this multilayer reflective film 13. The protective film 14 is formed with a material having ruthenium (Ru) as the main component thereof in order to protect the multilayer reflective film 13. The phase shift film 15 is formed on the protective film 14. The phase shift film 15 absorbs EUV light while reflecting a portion of the EUV light to cause a shift in the phase thereof.

In the present description, the description "multilayer reflective film 13 formed on a main surface of the substrate 12", for example, includes the case of referring to the multilayer reflective film 13 being disposed on the surface of the substrate 12 in contact therewith, as well as the case of having another film between the substrate 12 and the multilayer reflective film 13. This applies similarly to other films as well. In addition, in the present description, the description "film A is disposed on film B in contact therewith" refers to the film A and the film B being disposed so as to be in direct contact without having another film interposed between the film A and the film B.

The following provides an explanation of the configurations of substrate 12 and each layer.

A substrate having a low thermal expansion coefficient within the range of 0±5 ppb/° C. is preferably used for the substrate 12 in order to prevent strain of the absorber pattern caused by heat during exposure with EUV light. Examples of materials having a low thermal expansion coefficient within this range that can be used include $SiO_2$—$TiO_2$-based glass and multi-component glass ceramics.

One of the two main surfaces of the substrate 12 on the side where the phase shift pattern 15, which served as a reflective mask transfer pattern, is formed is subjected to surface processing so as to obtain high flatness at least from the viewpoints of pattern transfer accuracy and positional accuracy. In the case of EUV light, flatness in a region measuring 132 mm×132 mm on the side of the substrate 12 where the transfer pattern is formed is preferably not more than 0.1 μm, more preferably not more than 0.05 μm and particularly preferably not more than 0.03 μm. One of the two main surfaces of the substrate 12 on the opposite side from the side where the phase shift film 15 is formed is a surface where the back side conductive film 11 is formed for electrostatic chucking when placing in an exposure apparatus. Flatness of the surface where the back side conductive film 11 is formed in a region measuring 142 mm×142 mm is preferably not more than 1 μm, more preferably not more than 0.5 μm and particularly preferably not more than 0.3 μm.

Furthermore, in the present description, flatness is a value that represents warpage (amount of deformation) of a surface as indicated with the total indicated reading (TIR). When a flat surface determined according to the least squares method based on the surface of the substrate 12 is used as a focal plane, this value is a relative value of the height difference between the highest location of the surface of the substrate 12 above this focal plane and the lowest location of the surface of the substrate 12 below this focal plane.

In addition, in the case of EUV exposure, surface smoothness required for the substrate 12 is such that surface roughness of the main side of the substrate 12 where the phase shift film 15 serving as a transfer pattern is formed in terms of root mean square (RMS) roughness is preferably not more than 0.1 nm. Furthermore, surface smoothness can be measured with an atomic force microscope (AFM).

Moreover, the substrate 12 preferably has high rigidity in order to prevent deformation of a layer formed thereon (such as the multilayer reflective film 13) caused by film stress. In particular, the substrate 12 preferably has a high Young's modulus of not less than 65 GPa.

The multilayer reflective film 13 has a function that reflects EUV light in a reflective mask for EUV lithography. The multilayer reflective film 13 is a multilayer film obtained by cyclically laminating elements having different refractive indices.

In general, a multilayer film obtained by alternately laminating roughly 40 to 60 cycles of a thin film of high refractive index material in the form of a light element or compound thereof (high refractive index layer) and a thin film of a low refractive index material in the form of a heavy element or compound thereof (low refractive index layer) is used for the multilayer reflective film 13. The multilayer film can have a structure obtained by laminating for a plurality of cycles, with one cycle consisting of a laminated structure of a high refractive index layer/low refractive index layer obtained by laminating a high refractive index layer and low refractive index layer in that order starting from the side of the substrate 12. In addition, the multilayer film can have a structure obtained by laminating for a plurality of cycles, with one cycle consisting of a laminated structure of low refractive index layer/high refractive index layer, obtained by laminating a low refractive index layer and high refractive index layer in that order starting from the side of the substrate 12. Furthermore, the layer on the uppermost side of the multilayer reflective film 13, namely the surface layer of the multilayer reflective film 13 on the opposite side from the substrate 12, is preferably a high refractive index layer. In the aforementioned multilayer film, in the case of laminating for a plurality of cycles, with one cycle consisting of a laminated structure obtained by laminating a high refractive index layer/low refractive index layer obtained by laminating a high refractive index layer and a low refractive index layer in that order on the substrate 12, the uppermost layer is a low refractive index layer. Consequently, the multilayer reflective film 13 is preferably obtained by further forming a high refractive index layer on the low refractive index layer of the uppermost layer.

In the reflective mask blank 10 of the present disclosure, a layer containing Si can be used as a high refractive index layer. The material containing Si may be Si alone or a Si compound containing B, C, N and/or O. A reflective mask blank for EUV lithography having superior reflectance of EUV light is obtained by using a layer containing Si as a high refractive index layer. In addition, a glass substrate is preferably used for the substrate 12 in the reflective mask blank 10 of the present disclosure. Si is also superior in terms of adhesiveness with a glass substrate. In addition, a metal selected from Mo, Ru, Rh and Pt or an alloy thereof is used as a low refractive index layer. For example, a Mo/Si cyclically laminated film obtained by alternately laminating a Mo film and Si film for about 40 to 60 cycles is preferably used for the multilayer reflective film 13 for EUV light having a wavelength of 13 nm to 14 nm. Furthermore, the uppermost layer of the multilayer reflective film 13 in the form of a high refractive index layer may be formed with silicon (Si) and a silicon oxide layer containing silicon and oxygen may be formed between the uppermost layer (Si) and the protective layer 14. As a result, mask cleaning resistance (film separation resistance) can be improved.

Reflectance of this type of multilayer reflective film 13 alone is preferably, for example, not lower than 65% and normally the upper limit thereof is preferably 73%. Furthermore, the film thickness and number of cycles of each layer composing the multilayer reflective film 13 are suitably selected according to exposure wavelength so as to satisfy Bragg's law. Multiple layers high refractive index layers and low refractive index layers are each present in the multilayer reflective film 13. All of the high refractive index layers are not required to be of the same film thickness. In addition, all of the low refractive index layers are not required to be of the same film thickness. In addition, the film thickness of the Si layer of the uppermost surface of the multilayer reflective film 13 can be adjusted within a range that does cause a decrease in reflectance. The film thickness of the Si of the uppermost surface (high refractive index layer) can be, for example, 3 nm to 10 nm.

Methods for forming the multilayer reflective film 13 are known in the art. For example, each layer of the multilayer reflective film 13 can be deposited by ion beam sputtering. In the case of the aforementioned Mo/Si cyclically laminated film, a Si film having a film thickness of about 4 nm is first deposited on the substrate 12 by ion beam sputtering using a Si target, after which a Mo film having a film thickness of about 3 nm is deposited using a Mo target. The multilayer reflective film 13 is formed by laminating for a total of 40 to 60 cycles when defining the deposition of an Si film and Mo film as constituting one cycle (with the layer on the uppermost side being an Si layer).

The reflective mask blank 10 of the present disclosure preferably has the protective film 14 on the uppermost layer of the multilayer reflective film on the side of the phase shift film 15.

As shown in FIG. 1, the protective film 14 is formed on the multilayer reflective film 13 in order to protect the multilayer reflective film 13 from dry etching or cleaning solution in the reflective mask manufacturing process to be subsequently described. The protective film 14 is composed of, for example, a material containing Ru (ruthenium) as a main component thereof (main component: not less than 50 at %). Ru metal alone, a Ru alloy containing a metal such as Nb, Zr, Y, B, Ti, La, Mo, Co and/or Re, or a material containing N (nitrogen) along with these materials can be used for the material containing Ru as a main component thereof. In addition, the protective film 14 can have a multilayer structure of three or more layers. In this case, the uppermost layer and lowermost layer of the protective film 14 are layers comprised of materials containing the aforementioned Ru and metal other than Ru or alloy can be interposed between the lowermost layer and the uppermost layer.

There are no particular limitations on the film thickness of the protective film 14 provided the function of the protective film 14 is able to be demonstrated. From the viewpoint of reflectance of EUV light, the film thickness of the protective film 14 is preferably 1.5 nm to 8.0 nm and more preferably 1.8 nm to 6.0 nm.

A known deposition method can be used without any particular restrictions for the method for forming the protective film 14. Specific examples of methods used to form the protective film 14 include sputtering and ion beam sputtering.

As shown in FIG. 1, the reflective mask blank 10 of a first embodiment of the present disclosure contains the phase shift film 15 on the multilayer reflective film 13. The phase shift film 15 can be formed on the multilayer reflective film in contact therewith. In addition, in the case the protective film 14 is formed on the uppermost layer of the reflective multilayer film 13, the phase shift film 15 can be formed on the protective film 14 in contact therewith.

The alloy that composes the phase shift film 15 of the present disclosure is such that α and β are suitably set corresponding to reflectance of the surface of the phase shift film 15 with respect to EUV light. One type of metal element each is selected from Group A and Group B consisting of groups of metal elements that satisfy the aforementioned relational expressions of Formula (1) (k>α*n+β, α: proportional constant, β: constant) and Formula (2) (k<α*n+β, α: proportional constant, β: constant). The composition ratio of the metal elements is adjusted so that the aforementioned amount of change in phase difference is within the range of ±2 degrees and the amount of change in reflectance is within the range of ±0.2% when the film thickness of the phase shift film 15 has fluctuated by ±0.5% with respect to a set film thickness.

The following provides an explanation of three cases in which the reflectance of the phase shift film 15 to EUV light is (i) more than 5% and not more than 10%, (ii) more than 3% and not more than 5%, and (iii) more than 10% and not more than 20%.

(i) Case of Reflectance of Phase Shift Film 15 to EUV Light being More Than 5% and Not More Than 10%

In the case the reflectance of the phase shift film 15 to EUV light is more than 5% and not more than 10%, Formulas (1) and (2) become as indicated below.

$k > -0.303*n + 0.309$      Formula (1)

$k < -0.303 + n + 0.309$      Formula (2)

Examples of metal elements belonging to Group A that satisfy Formula (1) (k>−0.303*n+0.309) include Pd, Ag, Pt, Au, Ir, W, Cr, Co, Mn, Sn, Ta, V, Ni, Fe, Hf, Cu, Te, Zn, Mg, Ge and Al. Examples of metal elements belonging to Group B that satisfy Formula (2) (k<−0.303*n+0.309) include Rh, Ru, Mo, Nb, Ti, Zr, Y and Si. One or more types of metal element each is selected from Group A and Group B. The composition ratio of the metal elements is adjusted so that the aforementioned amount of change in phase shift difference is within the range of ±2 degrees and the amount of change in reflectance is within the range of ±0.2% when the film thickness of the aforementioned phase shift film 15 has fluctuated by ±0.5% with respect to a set film thickness.

Figure 4:
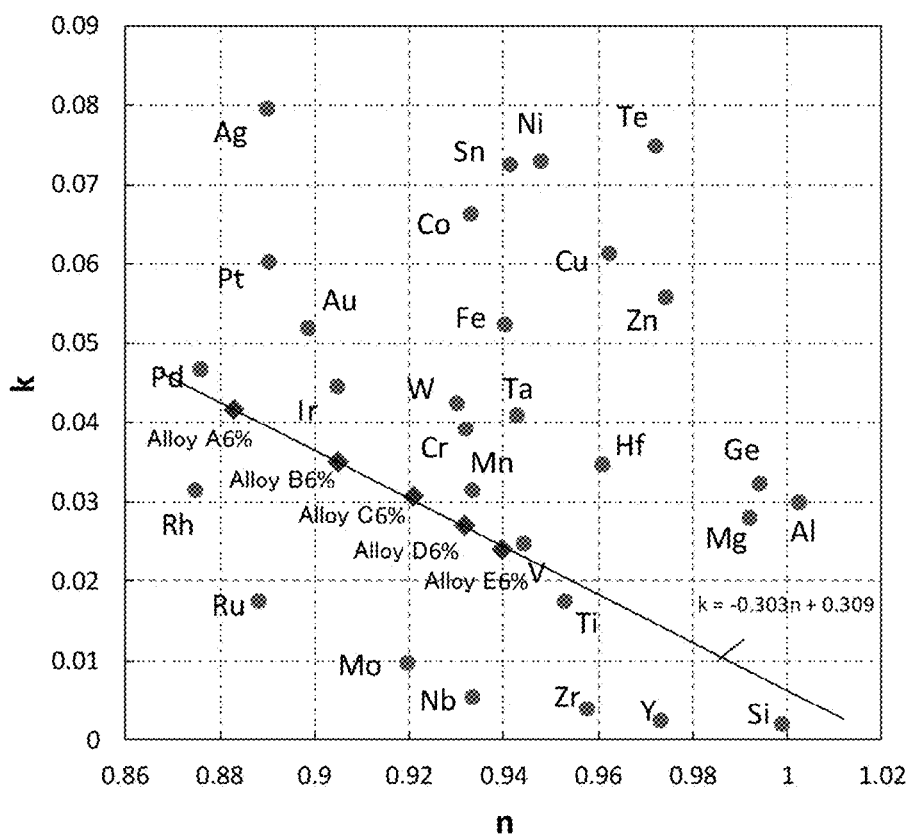
FIG. 4 is a graph for explaining a first embodiment of the present disclosure that indicates the properties of refractive index n and extinction coefficient k of an alloy that satisfies prescribed phase difference properties and reflectance properties in the case reflectance in EUV light (wavelength: 13.5 nm) is 6%.

FIG. 4 is a graph for explaining those metal elements that satisfy the relational expressions of Formula (1) and Formula (2) in the form of Group A and Group B in the case the reflectance of the surface of the phase shift film 15 to EUV light is 6%.

Examples of binary alloys for which the amount of change in phase difference of the phase shift film is within the range of ±2 degrees and the amount of change in reflectance is within the range of ±0.2% when the film thickness of the phase shift film has fluctuated by ±0.5% are as indicated below. Examples of Alloy $A_{6\%}$ having refractive index of 0.883 and extinction coefficient of 0.042 include PdMo alloys, PdNb alloys and PdZr alloys. Examples of Alloy $B_{6\%}$ having refractive index of 0.905 and extinction coefficient of 0.035 include RhTa alloys and RuNi alloys. Examples of Alloy $C_{6\%}$ having refractive index of 0.921 and extinction coefficient of 0.031 include TaRu alloys and CrRu alloys. Examples of Alloy $D_{6\%}$ having refractive index of 0.932 and extinction coefficient of 0.027 include MoTa alloys and WNb alloys. Examples of Alloy $E_{6\%}$ having refractive index of 0.940 and extinction coefficient of 0.024 include TaNb alloys and NiNb alloys.

Alloy $A_{6\%}$, Alloy $B_{6\%}$, Alloy $C_{6\%}$ or Alloy $D_{6\%}$ can be made to be ternary alloys of TaPdMo alloys or NiPdMo alloys.

Furthermore, the phase difference of the phase shift film 15 can be made to be about 180 degrees and reflectance can be made to be about 6% by making the film thicknesses of the aforementioned Alloy $A_{6\%}$, Alloy $B_{6\%}$, Alloy $C_{6\%}$, Alloy $D_{6\%}$ and Alloy $E_{6\%}$ to be 28.2 nm, 35.0 nm, 41.5 nm, 48.2 nm and 55.1 nm, respectively.

(ii) Case of Reflectance of Phase Shift Film 15 to EUV Light being More Than 3% and Not More Than 5%

In the case the reflectance of the phase shift film 15 to EUV light is more than 5% and not more than 10%, Formulas (1) and (2) become as indicated below.

$$k>-0.331*n+0.339 \quad \text{Formula (1)}$$

$$k<=0.331+n+0.339 \quad \text{Formula (2)}$$

Examples of metal elements belonging to Group A that satisfy Formula (1) (k>−0.331*n+0.339) include Ag, Pt, Au, Ir, W, Cr, Co, Mn, Sn, Ta, Ni, Hf, Cu, Te, Zn, Mg, Ge and Al. Examples of metal elements belonging to Group B that satisfy Formula (2) (k<−0.331*n+0.339) include Pd, Rh, Ru, Mo, Nb, V, Ti, Zr, Y and Si. One or more types of metal element each is selected from Group A and Group B, and the composition ratio of the metal elements is adjusted so that the aforementioned amount of change in phase shift difference is within the range of ±2 degrees and the amount of change in reflectance is within the range of ±0.2% when the film thickness of the aforementioned phase shift film 15 has fluctuated by ±0.5% with respect to a set film thickness.

Figure 5:
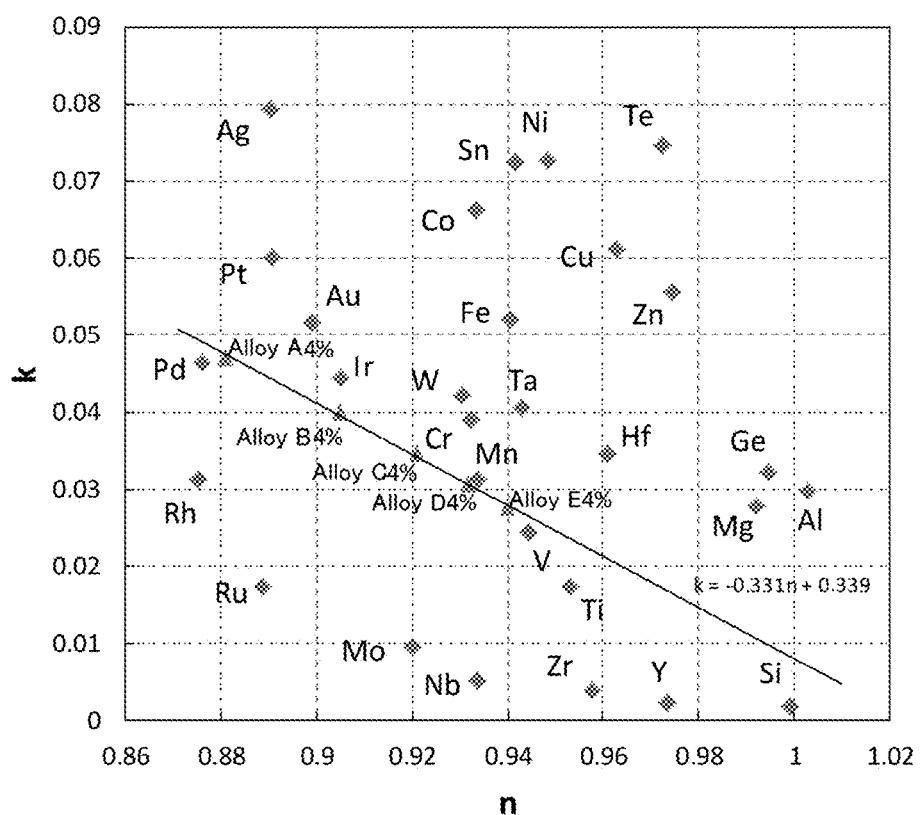
FIG. 5 is a graph for explaining a first embodiment of the present disclosure that indicates the properties of refractive index n and extinction coefficient k of an alloy that satisfies prescribed phase difference properties and reflectance properties in the case reflectance in EUV light (wavelength: 13.5 nm) is 4%.
Figure 6:
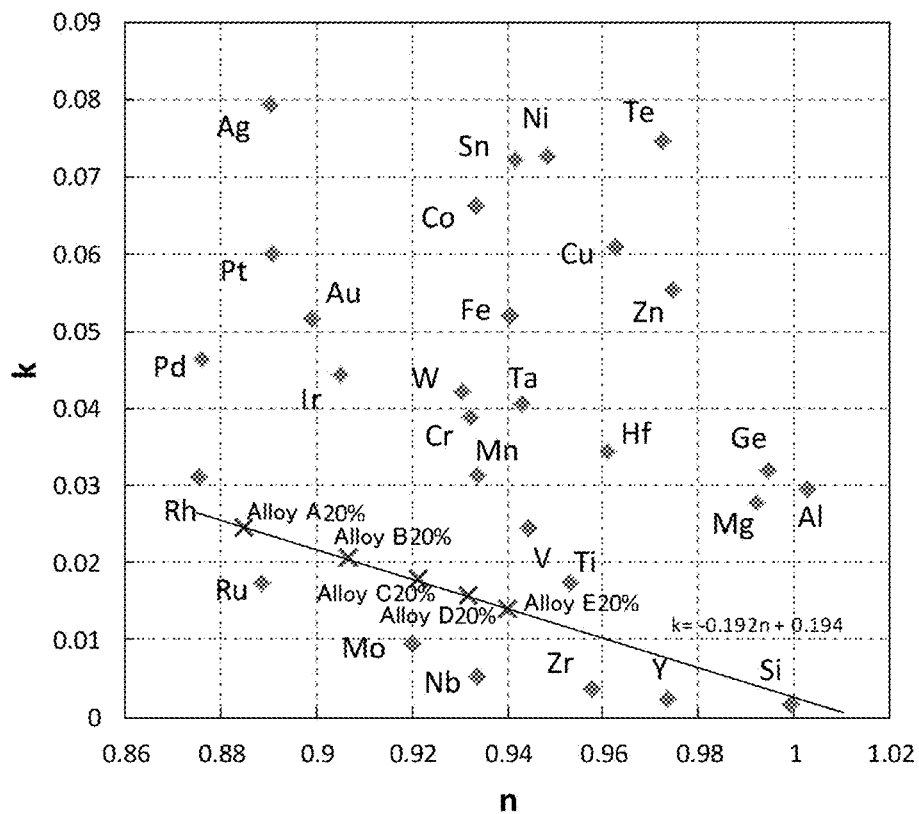
FIG. 6 is a graph for explaining a first embodiment of the present disclosure that indicates the properties of refractive index n and extinction coefficient k of an alloy that satisfies prescribed phase difference properties and reflectance properties in the case reflectance in EUV light (wavelength: 13.5 nm) is 20%.

FIG. 5 is a graph for explaining those metal elements that satisfy the relational expressions of Formula (1) and Formula (2) in the form of Group A and Group B in the case the reflectance of the surface of the phase shift film 15 to EUV light is 4%.

Examples of binary alloys for which the amount of change in phase difference of the phase shift film is within the range of ±2 degrees and the amount of change in reflectance is within the range of ±0.2% when the film thickness of the phase shift film has fluctuated by ±0.5% are as indicated below. Examples of Alloy $A_{4\%}$ having refractive index of 0.881 and extinction coefficient of 0.047 include RhAg alloys, PdFe alloys and PdZn alloys. Examples of Alloy $B_{4\%}$ having refractive index of 0.905 and extinction coefficient of 0.040 include RhFe alloys and RhZn alloys. Examples of Alloy $C_{4\%}$ having refractive index of 0.921 and extinction coefficient of 0.035 include CrRu alloys and RhHf alloys. Examples of Alloy $D_{4\%}$ having refractive index of 0.932 and extinction coefficient of 0.031 include NbW alloys and ZrPt alloys. Examples of Alloy $E_{4\%}$ having refractive index of 0.940 and extinction coefficient of 0.028 include CrZr alloys, WZr alloys and TaNb alloys.

Furthermore, the phase difference of the phase shift film 15 can be made to be about 180 degrees and reflectance can be made to be about 4% by making the film thicknesses of the aforementioned Alloy $A_{6\%}$, Alloy $B_{6\%}$, Alloy $C_{6\%}$, Alloy $D_{6\%}$ and Alloy $E_{6\%}$ to be 28.4 nm, 34.9 nm, 41.4 nm, 48.1 nm and 55.0 nm, respectively.

(iii) Case of Reflectance of Phase Shift Film 15 to EUV Light being More Than 10% and Not More Than 20%

In the case the reflectance of the phase shift film 15 to EUV light is more than 10% and not more than 20%, Formulas (1) and (2) become as indicated below.

$$k>-0.192*n+0.194 \quad \text{Formula (1)}$$

$$k<-0.192+n+0.194 \quad \text{Formula (2)}$$

Examples of metal elements belonging to Group A that satisfy Formula (1) (k>−0.192*n+0.194) include Rh, Pd, Ag, Pt, Au, Ir, W, Cr, Co, Mn, Sn, Ta, V, Ni, Ti, Hf, Cu, Te, Zn, Mg, Ge and Al. Examples of metal elements belonging to Group B that satisfy Formula (2) (k<−0.192*n+0.194) include Ru, Mo, Nb, Zr, Y and Si. Not less than type of metal element each is selected from Group A and Group B, and the composition ratio of the metal elements is adjusted so that the aforementioned amount of change in phase shift difference is within the range of ±2 degrees and the amount of change in reflectance is within the range of ±0.2% when the film thickness of the aforementioned phase shift film 15 has fluctuated by ±0.5% with respect to a set film thickness.

Examples of binary alloys for which amount of change in phase shift difference is within the range of ±2 degrees and the amount of change in reflectance is within the range of ±0.2% when the film thickness of the aforementioned phase shift film 15 has fluctuated by ±0.5% with respect to a set film thickness are as indicated below. Examples of Alloy $A_{20\%}$ having refractive index of 0.885 and extinction coefficient of 0.025 include PdRu alloys. Examples of Alloy $B_{20\%}$ having refractive index of 0.907 and extinction coefficient of 0.021 include PdMo alloys and RuGe alloys. Examples of Alloy $C_{20\%}$ having refractive index of 0.922 and extinction coefficient of 0.018 include MoCo alloys. Examples of Alloy $D_{20\%}$ having refractive index of 0.932 and extinction coefficient of 0.016 include WNb alloys and MoHf alloys. Examples of Alloy $E_{20\%}$ having refractive index of 0.940 and extinction coefficient of 0.014 include HfNb alloys and ZnNb alloys.

Furthermore, the phase difference of the phase shift film 15 can be made to be about 180 degrees and reflectance can be made to be about 20% by making the film thicknesses of the aforementioned Alloy $A_{20\%}$, Alloy $B_{20\%}$, Alloy $C_{20\%}$, Alloy $D_{20\%}$ and Alloy $E_{20\%}$ to be 28.2 nm, 35.0 nm, 41.7 nm, 48.6 nm and 55.4 nm, respectively.

The phase shift film 15 of the present disclosure can contain at least one type of element selected from oxygen, nitrogen, carbon and boron within a range that does not deviate from the effects of the present disclosure.

In addition, the film thickness of the phase shift film 15 is suitably set so that the phase difference with respect to EUV light is 170 degrees to 190 degrees and reflectance is more than 3% and not more than 20%. From the viewpoint of reducing the shadowing effect, the film thickness of the phase shift film 15 is preferably not less than 25 nm and not more than 70 nm. The film thickness of the phase shift film 15 is more preferably not less than 25 nm and not more than 50 nm and even more preferably not less than 25 nm and not more than 40 nm.

If the surface of the phase shift film 15 is not smooth, edge roughness of the phase shift film pattern may increase and pattern dimensional accuracy may become poor. Consequently, surface roughness of the phase shift film 15 after deposition in terms of the root mean square (RMS) roughness is preferably not more than 0.5 nm, more preferably not more than 0.4 nm and even more preferably not more than 0.3 nm.

An etching mask film (not shown) can be further formed on the phase shift film 15 in the reflective mask blank of the present disclosure. The etching mask film is formed with a material that has etching selectivity with respect to the uppermost layer of the multilayer reflective film 13 and enables the phase shift film 15 to be etched with an etching gas (not having etching selectivity). The etching mask film can be formed by a known method such as DC sputtering or RF sputtering.

The film thickness of the etching mask film is preferably not less than 5 nm from the viewpoint of securing the function of a hard mask. In consideration of the film thickness of the phase shift film 15, the film thickness of the etching mask film is desired to be not less than 5 nm and not more than 20 nm, and preferably not less than 5 nm and not more than 15 nm.

As shown in FIG. 1, the back side conductive film 11 for electrostatic chucking is formed on the back side of the substrate 12 (opposite side from the side where the multilayer reflective film 13 is formed). The back side conductive film 11 for electrostatic chucking is required to demonstrate the electrical property of normally having sheet resistance of not more than 100 Ω/sq. The back side conductive film 11 can be formed by magnetron sputtering or ion beam sputtering using a metal such as chromium or tantalum, or an alloy thereof, for the target. In the case of forming the back side conductive film 11 with CrN, for example, the back side conductive film 11 can be deposited by the aforementioned sputtering using a Cr target in a gas atmosphere such as that containing nitrogen (N). Although there are no particular limitations on the film thickness of the back side conductive film 11 provided it allows the film to fulfill the function of using for electrostatic chucking, it is normally 10 nm to 200 nm.

Furthermore, the reflective mask blank 10 of the present disclosure is not limited to that of the aforementioned embodiment. For example, the reflective mask blank 10 of the present disclosure can be provided with a resist film having the function of an etching mask on the phase shift film 15. In addition, the reflective mask blank 10 of the present disclosure can be provided with the phase shift film 15 on the multilayer reflective film 13 in direct contact therewith instead of being provided with the protective film 14 on the multilayer reflective film 13.

<Reflective Mask and Manufacturing Method Thereof>

The present disclosure is a reflective mask having a phase shift film pattern obtained by patterning the phase shift film 15 in the reflective mask blank 10 of the present disclosure as previously described. The reflective mask of the present disclosure can be manufactured using the aforementioned reflective mask blank 10 of the present disclosure. Electron beam lithography, which enables high-definition patterning, is most preferable for the manufacturing of reflective masks for EUV lithography.

In the present embodiment, the method of manufacturing a reflective mask using photolithography is explained using, as an example, the case of using the reflective mask blank 10 shown in FIG. 1.

First, a resist film (not shown) is formed on the uppermost side (phase shift film 15) of the reflective mask blank 10 shown in FIG. 1. The thickness of the resist film can be, for example, 100 nm. Next, a desired pattern is drawn (exposed) on this resist film followed by developing and rinsing to form a prescribed resist pattern (not shown).

Next, a phase shift film pattern (not shown) is formed by carrying out dry etching with an etching gas containing a fluorine-based gas such as $SF_6$ or chlorine-based gas such as $Cl_2$ corresponding to the material of the phase shift film 15 and using the resist pattern (not shown) as a mask. The resist pattern (not shown) is removed in this step.

Here, the etching rate of the phase shift film 15 is dependent on conditions such as the material used to form the phase shift film 15 and the etching gas.

A phase shift film pattern is formed in the aforementioned step. Next, wet cleaning is carried out using an acidic or alkaline aqueous solution to obtain a reflective mask for EUV lithography that achieves high reflectance.

Furthermore, a fluorine-based gas such as $CHF_3$, $CF_4$, $C_2F_6$, $C_3F_6$, $C_4F_6$, $C_4F_8$, $CH_2F_2$, $CH_3F$, $C_3F_8$ or F in addition to $SF_6$ or mixed gases containing these fluorine-based gases and $O_2$ at a prescribed ratio can be used for fluorine-based gas.

Examples of other etching gases that can be used include at least one type of gas selected from the group consisting of chlorine-based gases such as $Cl_2$, $SiCl_4$, $CHCl_3$, $CCl_4$ or $BCl_3$ and mixed gases thereof, mixed gases containing a chlorine-based gas and He at a prescribed ratio, mixed gases containing a chlorine-based gas and Ar at a prescribed ratio, halogen-based gases containing at least one type of gas selected from fluorine gas, chlorine gas, bromine gas and iodine gas, and hydrogen halide gases. Moreover, a mixed gas containing these gases and oxygen gas can be used for the etching gas.

Since the aforementioned reflective mask blank 10 is used to manufacture the reflective mask of the present disclosure, a reflective mask can be obtained that has a phase shift film pattern having a desired phase difference property and reflectance property.

<Manufacturing of Semiconductor Device>

The present disclosure is a method of manufacturing a semiconductor device that includes a pattern formation step for forming a pattern on a semiconductor substrate using the previously described reflective mask of the present disclosure.

A transfer pattern based on the phase shift film pattern of a reflective mask can be formed on a semiconductor substrate by EUV lithography using the previously described reflective mask of the present disclosure. Subsequently, a semiconductor device having various patterns and the like formed on the semiconductor substrate can be manufactured by going through various other steps. A known pattern transfer apparatus can be used to form the transfer pattern.

According to the method of manufacturing a semiconductor device of the present disclosure, since a reflective mask can be used that has a phase shift pattern having little dependency of phase difference and reflectance on film thickness, a semiconductor device can be manufactured that has a fine and highly accurate transfer pattern.

Second Embodiment

The phase shift film 15 of the reflective mask blank 10 in a second embodiment of the present disclosure has a broader tolerance for phase difference variation and reflectance variation than the first embodiment.

The phase shift film 15 is composed of a material comprised of an alloy having two or more types of metals so that reflectance $R_0$ of EUV light of the surface of the phase shift film with respect to light reflected from the aforementioned multilayer reflective film prior to formation of the phase shift film 15 is 4%, 6% or 12% and so that the phase difference $\theta_0$ is 180 degrees. By adjusting the composition ratio of this alloy, the tolerance of the phase difference $\theta$ becomes ±5 degrees ($\theta_0-5$ degrees$\leq\theta\leq\theta_0+5$ degrees) and the tolerance of reflectance R becomes $0.9R_0 \leq R \leq 1.1R_0$ when film thickness of the phase shift film 15 has fluctuated by ±0.5% with respect to a set film thickness. The refractive index n and extinction coefficient k of this alloy at the wavelength of EUV light are within prescribed ranges.

Figure 7:
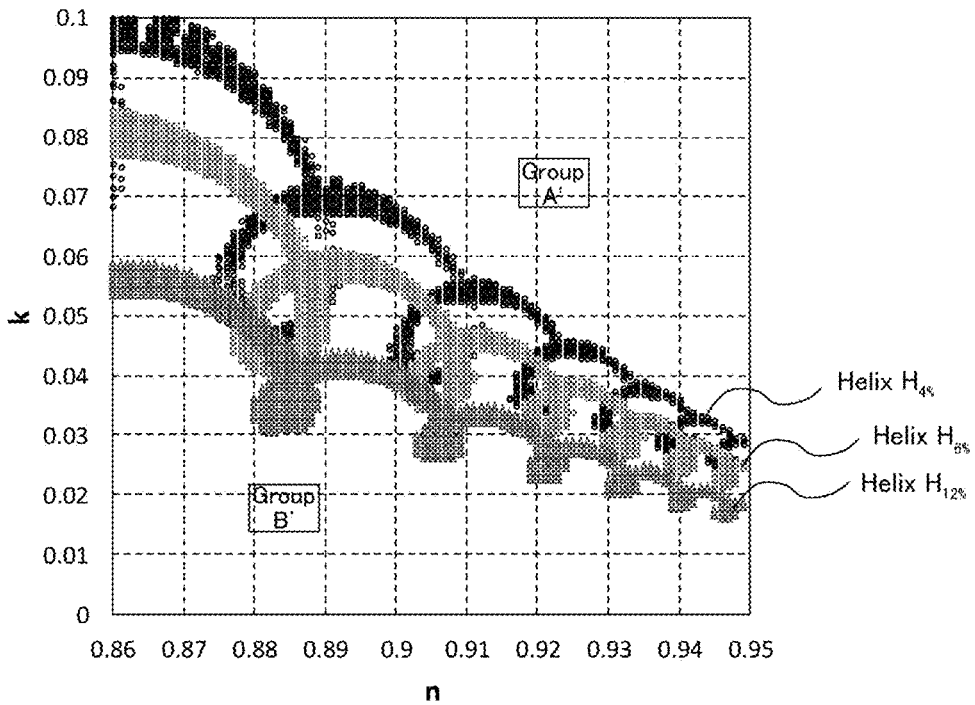
FIG. 7 is a graph for explaining a second embodiment of the present disclosure that indicates the ranges of refractive index n and extinction coefficient k that satisfy prescribed phase difference properties and reflectance properties in the cases reflectance in EUV light (wavelength: 13.5 nm) is 4%, 6% and 12%.

FIG. 7 is a graph indicating the ranges of refractive index n and extinction coefficient k that satisfy prescribed phase difference properties and reflectance properties in the case reflectance in EUV light (wavelength: 13.5 nm) is 4%, 6% and 12%.

The Helix $H_{6\%}$ is a group when refractive index and extinction coefficient are plotted for a tolerance of phase difference $\theta$ of ±5 degrees ($\theta_0-5$ degrees$\leq\theta\leq\theta_0+5$ degrees) and a tolerance of reflectance R of $0.9R_0 \leq R \leq 1.1R_0$ when film thickness of the phase shift film 15 has fluctuated by ±0.5% with respect to a set film thickness in the case of reflectance $R_0$ is 6%. Here, the tolerance of phase difference $\theta$ is 175 degrees to 185 degrees and the tolerance of reflectance R is 5.4% to 6.6%.

Similarly, the Helix $H_{4\%}$ of FIG. 7 indicates the case in which phase difference $\theta_0$ with respect to EUV light is 180 degrees and reflectance $R_0$ is 4%, and the tolerance of phase difference $\theta$ becomes 175 degrees to 185 degrees while the tolerance of reflectance R becomes 3.6% to 4.4%. In addition, Helix $H_{12\%}$ of FIG. 7 indicates the case in which phase difference $\theta_0$ with respect to EUV light is 180 degrees and reflectance $R_0$ is 12%, and the tolerance of phase difference $\theta$ becomes 175 degrees to 185 degrees while the tolerance of reflectance R becomes 10.8% to 13.2%.

Similar to the first embodiment, metals can be divided into metals of Group A' and metals of Group B' having Helix $H_{4\%}$, Helix $H_{6\%}$ or Helix $H_{12\%}$ interposed there between. The aforementioned alloy can be obtained by selecting one or more types of metal each from Group A' and Group B'. In the case the metal contained within the Helix $H_{6\%}$ is a metal of Group A', examples of metal elements belonging to Group A' include Ag, Pt, Ir, W, Cr, Co, Mn, Sn, Ta, V, Ni, Hf, Fe, Cu, Te, Zn, Mg, Ge and Al. In this case, examples of metal elements belonging to Group B' include Au, Pd, Rh, Ru, Mo, Nb, Ti, Zr and Y.

In the second embodiment of the present disclosure, the reflective mask blank 10 and the reflective mask can be manufactured in the same manner as the first embodiment of the present disclosure with the exception of composing the material of the phase shift film 15 in the manner described above.

Third Embodiment

The following provides an explanation of the phase shift film 15 of the reflective mask blank 10 in a third embodiment of the present disclosure. When manufacturing a plurality of reflective mask blanks, there are cases in which reflective mask blanks are manufactured that each have different reflectance. In that case, it is difficult to obtain a phase shift film capable of accommodating a plurality of reflectance without changing the material (and further, the composition ratio thereof) while retaining a desired phase difference property and reflectance property. The phase shift film 15 in the third embodiment of the present disclosure is composed of a material comprising an alloy capable of accommodating a plurality of reflectance simply by changing the set film thickness.

The phase shift film 15 is composed of a material comprising an alloy having two or more types of metal so that reflectance $R_0$ of EUV light of the surface of the phase shift film with respect to light reflected from the aforementioned multilayer reflective film prior to deposition of the phase shift film 15 is 4%, 6% or 12% and phase difference $\theta_0$ is 180 degrees. By adjusting the composition ratio of this alloy, the tolerance of the phase difference $\theta$ becomes ±5 degrees ($\theta_0-5$ degrees$\leq\theta\leq\theta_0+5$ degrees) and the tolerance of reflectance R becomes $0.9R_0 \leq R \leq 1.1R_0$ when film thickness of the phase shift film 15 has fluctuated by ±0.5% with respect to a set film thickness. The refractive index n and extinction coefficient k of this alloy at the wavelength of EUV light are within prescribed ranges. This alloy is capable of accommodating a plurality of reflectance values simply by changing the set film thickness.

(i) Case of Reflectance $R_0$ Being Able to Accommodate Three Reflectance Values of 4%, 6% and 12%

Figure 8:
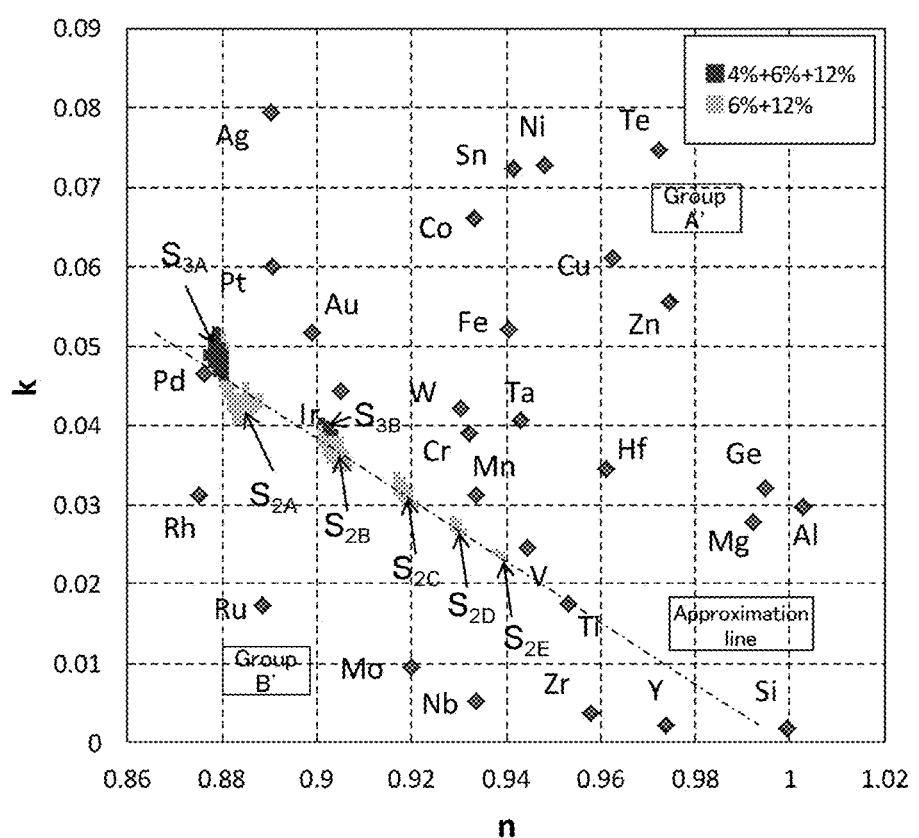
FIG. 8 is a graph for explaining a third embodiment of the present disclosure that indicates the ranges of refractive index n and extinction coefficient k that satisfy the overlapping portions of FIG. 7.

FIG. 8 is a graph indicating the ranges of refractive index n and extinction coefficient k that satisfy the overlapping portions of FIG. 7. Spot $S_{3A}$ and Spot $S_{3B}$ of FIG. 8 represent gathering points when refractive index and extinction coefficient are plotted that are able to accommodate three reflectance values of reflectance $R_0$ of 4%, 6% and 12%. Namely, Spot $S_{3A}$ and Spot $S_{3B}$ indicate the overlapping portions of Helix $H_{4\%}$, Helix $H_{6\%}$ and Helix $H_{12\%}$ of FIG. 7.

Spot $S_{3A}$ is contained within the range of a refractive index of 0.877 to 0.881 and an extinction coefficient of 0.046 to 0.052. In addition, Spot $S_{3B}$ is contained within the range of a refractive index of 0.901 to 0.904 and an extinction coefficient of 0.039 to 0.041.

The aforementioned alloy can be obtained by dividing metal elements into Group A' and Group B' interposed by an approximation line connecting Spot $S_{3A}$ and Spot $S_{3B}$ there between and selecting one or more types of metal element each from Group A' and Group B'. Examples of metal elements belonging to Group A' include Ag, Pt, Au, Ir, W, Cr, Co, Mn, Sn, Ta, V, Ti, Ni, Hf, Fe, Cu, Te, Zn, Mg, Ge, Al and Si. Examples of metals belonging to Group B' include Pd, Rh, Ru, Mo, Nb, Zr and Y.

Examples of binary alloys of the aforementioned alloys include AgPd alloys, PtPd alloys, AuPd alloys, IrPd alloys, CoPd alloys, SnPd alloys, NiPd alloys, TePd alloys, CuPd alloys, FePd alloys, WPd alloys, CrPd alloys, TaPd alloys, ZnPd alloys, HfPd alloys, GePd alloys, AlPd alloys, MgPd alloys, AgRh alloys, CuRh alloys, FeRh alloys and IrRu alloys. For example, a PtPd alloy preferably has a composition ratio of 0.10:0.90 to 0.25:0.75.

(ii) Case of Reflectance $R_0$ Being Able to Accommodate Two Reflectance Values of 6% and 12%

Spot $S_{2A}$, Spot $S_{2B}$, Spot $S_{2C}$, Spot $S_{2D}$ and Spot $S_{2E}$ of FIG. 8 represent gathering points when refractive index and extinction coefficient are plotted that are able to accommodate two reflectance values of reflectance $R_0$ of 6% and 12%. Namely, Spot $S_{2A}$, Spot $S_{2B}$, Spot $S_{2C}$, Spot $S_{2D}$ and Spot $S_{2E}$ indicate the overlapping portions of Helix $H_{6\%}$ and Helix $H_{12\%}$ of FIG. 7.

Spot $S_{2A}$ is contained within the range of a refractive index of 0.880 to 0.888 and an extinction coefficient of 0.041 to 0.046 in addition to the ranges of refractive index and extinction coefficient of the aforementioned Spot $S_{3A}$. Spot $S_{2B}$ is contained within the range of a refractive index of 0.901 to 0.907 and an extinction coefficient of 0.035 to 0.041 in addition to the ranges of refractive index and extinction coefficient of the aforementioned Spot $S_{3B}$. Spot $S_{2C}$ is contained within the range of a refractive index of 0.917 to 0.921 and an extinction coefficient of 0.030 to 0.034. Spot $S_{2D}$ is contained within the range of a refractive index of 0.929 to 0.931 and an extinction coefficient of 0.027 to 0.028. Spot $S_{2E}$ is contained within the range of a refractive index of 0.938 to 0.939 and an extinction coefficient of 0.024.

The aforementioned alloy can be obtained by dividing metal elements into Group A' and Group B' interposed by an approximation line connecting Spot $S_{2A}$ (including Spot $S_{3A}$), Spot $S_{2B}$ (including Spot $S_{3B}$), Spot $S_{2C}$, Spot $S_{2D}$ and Spot $S_{2E}$ there between and selecting one or more types of metal element each from Group A' and Group B'. Examples of metal elements belonging to Group A' include Ag, Pt, Au, Ir, W, Cr, Co, Mn, Sn, Ta, V, Ni, Hf, Fe, Cu, Te, Zn, Mg, Ge, Al and Si. Examples of metals belonging to Group B' include Pd, Rh, Ru, Mo, Nb, Ti, Zr and Y.

Examples of binary alloys of the aforementioned alloys include PtMo alloys, AuMo alloys, NiMo alloys, FeMo alloys, ZnMo alloys, MnMo alloys, AgNb alloys, NiNb alloys, WNb alloys, TaNb alloys, MnPd alloys, VPd alloys, TiPd alloys, PtRh alloys, AuRh alloys, WRh alloys, CrRh alloys, TaRh alloys, ZnRh alloys, MnRh alloys, HfRh alloys, GeRh alloys, AlRh alloys, MgRh alloys, CoRu alloys, SnRu alloys, NiRu alloys, WRu alloys, CrRu alloys, TaRu alloys, ZnRu alloys, HfRu alloys, GeRu alloys, VRu alloys, IrY alloys, PtZr alloys and the aforementioned AuZr alloys. For example, a PtMo alloy preferably has a composition ratio of 0.60:0.40 to 0.55:0.45.

In the third embodiment of the present disclosure, the reflective mask blank 10 and a reflective mask can be manufactured in the same manner as the first embodiment of the present disclosure with the exception of composing the material of the phase shift film 15 in the manner described above.

EXAMPLES

The following provides an explanation of the present disclosure based on each of the embodiments.

Example 1

<Manufacturing of Reflective Mask Blank 10>

The reflective mask blank 10 of Example 1 having a reflectance property of the phase shift film 15 of 6% was manufactured according to the method described below. The reflective mask blank 10 has a structure in which a Mo/Si multilayer reflective layer 13, a Ru protective film 14 and the phase shift film 15 are laminated on the substrate 12 and a CrN conductive film is formed on the back side of the substrate 12.

First, a $SiO_2$—$TiO_2$-based glass substrate 12 was prepared.

The back side conductive film 11 comprised of CrN was formed on the back side of the substrate 12 by magnetron sputtering under the following conditions. Namely, the back side conductive film 11 was formed using a Cr target in an $Ar+N_2$ gas atmosphere ($Ar:N_2=90\%:10\%$) so as to have a film thickness of 20 nm.

Next, the multilayer reflective film 13 was formed on a main surface of the substrate 12 on the opposite side from the side where the back side conductive film 11 was formed. A Mo/Si cyclically laminated multilayer reflective film 13 suitable for EUV light of 13.5 nm was employed for the multilayer reflective film 13 formed on the substrate 12. The multilayer reflective film 13 was formed by alternatively laminating Mo layers and Si layers on the substrate 12 by ion beam sputtering (Ar gas atmosphere) using a Mo target and a Si target. First, a Si film was deposited at a film thickness of 4.2 nm followed by depositing a Mo film at a film thickness of 2.8 nm. With the deposition of these two films constituting one cycle, the films were similarly laminated for 40 cycles followed by finally depositing a Si film at a film thickness of 4.0 nm to form the multilayer reflective layer 13 (total film thickness: 284 nm).

Continuing, the protective film 14 containing Ru was formed at a film thickness of 2.5 nm on the Si film of the uppermost layer of the multilayer reflective film 13 by ion beam sputtering (Ar gas atmosphere) using a Ru target.

Next, the phase shift film 15 was formed on the protective film 14 according to the following method. Namely, sputtering using a PdMo target (Pd:Mo=0.86:0.14) was carried out in an Ar gas atmosphere to form the phase shift film 15 comprised of PdMo alloy having a set film thickness of 28.2 nm. The reflective film blank 10 was obtained in this manner. Furthermore, the composition ratio of the PdMo alloy of this phase shift film 15 has a similar composition ratio to the target composition ratio.

After having manufactured ten reflective mask blanks 10 using the method described above, the refractive index and extinction coefficient of the phase shift film 15 were measured using EUV light (wavelength: 13.5 nm) for each reflective mask blank 10. As a result, the phase shift film formed on the reflective mask blank 10 had a refractive index of 0.883 and an extinction coefficient of 0.042.

Thus, the phase shift film 15 of the reflective mask blank 10 obtained here was determined by simulation to have a phase difference variation of 180 degrees±1.3 degrees and a reflectance variation of 6%±0.1%.

<Manufacturing of Reflective Mask>

Next, ten reflective mask blanks 10 of Example 1 were manufactured in the manner described above. A resist film was formed at a film thickness of 100 nm on the phase shift film 15 of each of the ten manufactured reflective mask blanks, and a resist pattern was formed by drawing and developing. Subsequently, the phase shift film 15 was dry etched by using this resist pattern as a mask and using fluorine-based $SF_6$ gas to form a phase shift film pattern. Subsequently, the resist pattern was removed to manufacture ten reflective masks.

When phase difference and reflectance were measured using light reflected from the surface of the phase shift film pattern and light reflected from the surface of the multilayer reflective film using EUV light, phase difference variation was 180 degrees±1.8 degrees and reflectance variation was 6%±0.1%, thereby demonstrating small values.

<Manufacturing of Semiconductor Device>

The reflective mask obtained in Example 1 was placed in a EUV scanner, a wafer having a processed film and a resist film formed on the semiconductor substrate 12 was exposed to EUV light, and this exposed resist film was developed to form a resist pattern on the semiconductor substrate 12 having the processed film formed thereon.

The reflective mask of Example 1 was a reflective mask having a phase shift film pattern formed thereon that had a desired phase difference property (phase difference variation of 180 degrees±1.3 degrees) and reflectance property (reflectance variation of 6%±0.1%). Consequently, a semiconductor device having a fine and highly accurate transfer pattern was able to be manufactured by using this reflective mask.

Moreover, a semiconductor device having desired properties was able to be manufactured at high yield by transferring the resist pattern to a processed film by etching and further going through various steps such as forming an insulating film or conductive film, introducing a dopant or subjecting to annealing.

Example 2

A reflective mask blank and reflective mask were manufactured in the same manner as Example 1 with the exception of using a TaPdMo alloy (Ta:Pd:Mo=0.015:0.869:0.116, set film thickness=28.2 nm) for the phase shift film 15 used in the aforementioned Example 1.

As a result, the reflectance of the phase shift film 15 formed on the reflective mask blank 10 was 0.883 and the extinction coefficient was 0.042. In addition, in the phase shift film 15, the phase difference variation as determined by simulation was 180 degrees±1.3 degrees) and reflectance variation was 6%±0.1%. In addition, phase difference variation of the reflective mask was 180 degrees±1.3 degrees and reflectance variation was 6%±0.1%.

Examples 3 to 8

Reflective mask blanks and reflective masks were manufactured in the same manner as Example 1 with the exception of changing the phase shift film 15 used in Example 1 to the materials (alloys, composition ratios) and set film thicknesses shown in Table 1 below. In addition, the refractive indices, extinction coefficients, phase difference variations and reflectance variations of the phase shift films 15 obtained by measuring in the same manner as Example 1 yielded the results shown in Table 2.

TABLE 1

| Example No. | Material | Composition Ratio | Set Film Thickness (nm) |
|---|---|---|---|
| Example 3 | RhTa | Rh:Ta = 0.62:0.38 | 35.0 |
| Example 4 | RuNi | Ru:Ni = 0.65:0.35 | 35.0 |
| Example 5 | TaRu | Ta:Ru = 0.55:0.45 | 41.5 |
| Example 6 | CrRu | Cr:Ru = 0.77:0.23 | 41.5 |
| Example 7 | MoTa | Mo:Ta = 0.59:0.41 | 48.2 |
| Example 8 | TaNb | Ta:Nb = 0.53:0.47 | 55.1 |

TABLE 2

| Example No. | Refractive Index | Extinction Coefficient | Phase Difference Variation | Reflectance Variation |
|---|---|---|---|---|
| Example 3 | 0.905 | 0.035 | 180 degrees ± 1.8 degrees | 6% ± 0.1% |
| Example 4 | 0.905 | 0.035 | 180 degrees ± 1.8 degrees | 6% ± 0.1% |
| Example 5 | 0.921 | 0.031 | 180 degrees ± 1.8 degrees | 6% ± 0.1% |
| Example 6 | 0.921 | 0.031 | 180 degrees ± 1.8 degrees | 6% ± 0.1% |
| Example 7 | 0.932 | 0.027 | 180 degrees ± 1.9 degrees | 6% ± 0.1% |
| Example 8 | 0.940 | 0.024 | 180 degrees ± 1.8 degrees | 6% ± 0.1% |

Furthermore, in the aforementioned Examples 3 to 8, a material was suitably selected for the material of the protective film 14 that has etching resistance to dry etching gas used when patterning the phase shift film 15.

As indicated by the above results, the reflective mask blanks and reflective masks demonstrated small values for phase difference variation and reflectance variation in Examples 3 to 8 as well.

Examples 9 and 10

The reflective mask blank 10 having the property of reflectance of the phase shift film 15 of 4% was manufactured in Example 9 and the reflective mask blank 10 having the property of reflectance of the phase shift film 15 of 20% was manufactured in Example 10. The back side conductive film 11, the multilayer reflective film 13 and the protective film 14 were the same as in Example 1.

Reflective mask blanks and reflective masks were manufactured in the same manner as Example 1 with the exception of changing the phase shift film 15 used in Example 1 to the materials (alloys, composition ratios) and set film thicknesses shown in Table 3 below. In addition, the refractive indices, extinction coefficients, phase difference variations and reflectance variations of the phase shift films 15 obtained by measuring in the same manner as Example 1 yielded the results shown in Table 4.

TABLE 3

| Example No. | Material | Composition Ratio | Set Film Thickness (nm) |
|---|---|---|---|
| Example 9 | TaNb | Ta:Nb = 0.62:0.38 | 55.0 |
| Example 10 | PdRu | Pd:Ru = 0.24:0.76 | 28.2 |

TABLE 4

| Example No. | Refractive Index | Extinction Coefficient | Phase Difference Variation | Reflectance Variation |
|---|---|---|---|---|
| Example 9 | 0.940 | 0.028 | 180 degrees ± 1.9 degrees | 4% ± 0.1% |
| Example 10 | 0.885 | 0.025 | 179 degrees ± 0.9 degrees | 20% ± 0.1% |

As indicated by the aforementioned results, the reflective mask blanks and reflective masks demonstrated small values for phase difference variation and reflectance variation in Examples 9 and 10 as well.

The reflective masks of Examples 3 to 10 are reflective masks having a phase shift film pattern formed thereon that has a desired phase difference property (phase difference of 180 degrees±2 degrees) and desired reflectance property (reflectance variation of 6%±0.1%, 4%±0.1% or 20%±0.1%). Consequently, a semiconductor device having a fine and highly accurate transfer pattern was able to be manufactured by using these reflective masks.

Moreover, a semiconductor device having desired properties was able to be manufactured at high yield by transferring the resist pattern to a processed film by etching and further going through various steps such as forming an insulating film or conductive film, introducing a dopant and/or subjecting to annealing.

Examples 11 to 15

Reflective mask blanks and reflective masks were manufactured in the same manner as Example 1 with the exception of changing the phase shift film 15 used in Example 1 to the materials (alloys, composition ratios) and set film thicknesses shown in Table 5 below. In addition, the refractive indices, extinction coefficients, phase difference variations and reflectance variations of the phase shift films 15 obtained by measuring in the same manner as Example 1 yielded the results shown in Tables 6-1 and 6-2.

TABLE 5

| | | | Set Film Thickness (nm) | | |
|---|---|---|---|---|---|
| Example No. | Material | Composition Ratio | $R_0 = 4\%$ | $R_0 = 6\%$ | $R_0 = 12\%$ |
| Example 11 | AgPd | Ag:Pd = 0.12:0.88 | 29.2 | 30.0 | 25.1 |
| Example 12 | PtPd | Pt:Pd = 0.10:0.90 | 28.8 | 29.7 | 25.3 |
| Example 13 | PtPd | Pt:Pd = 0.25:0.75 | 29.0 | 29.8 | 25.1 |
| Example 14 | SnPd | Sn:Pd = 0.04:0.96 | 28.5 | 29.6 | 25.3 |
| Example 15 | TaPd | Ta:Pd = 0.06:0.94 | 28.3 | 29.3 | 25.5 |

TABLE 6-1

| | Refractive | Extinction | Reflectance Variation | | |
|---|---|---|---|---|---|
| Example No. | Index | Coefficient | $R_0 = 4\%$ | $R_0 = 6\%$ | $R_0 = 12\%$ |
| Example 11 | 0.878 | 0.051 | $0.91R_0 \sim 1.07R_0$ | $0.92R_0 \sim 1.04R_0$ | $0.93R_0 \sim 1.00R_0$ |
| Example 12 | 0.878 | 0.048 | $0.94R_0 \sim 1.05R_0$ | $0.93R_0 \sim 1.06R_0$ | $0.99R_0 \sim 1.07R_0$ |
| Example 13 | 0.880 | 0.050 | $0.93R_0 \sim 1.07R_0$ | $0.92R_0 \sim 1.04R_0$ | $0.95R_0 \sim 1.03R_0$ |
| Example 14 | 0.881 | 0.048 | $0.92R_0 \sim 1.00R_0$ | $0.95R_0 \sim 1.07R_0$ | $0.96R_0 \sim 1.04R_0$ |
| Example 15 | 0.881 | 0.046 | $1.05R_0 \sim 1.09R_0$ | $0.93R_0 \sim 1.05R_0$ | $0.97R_0 \sim 1.06R_0$ |

TABLE 6-2

| | Refractive | Extinction | Phase Difference Variation | | |
|---|---|---|---|---|---|
| Example No. | Index | Coefficient | $R_0 = 4\%$ | $R_0 = 6\%$ | $R_0 = 12\%$ |
| Example 11 | 0.878 | 0.051 | 180 degrees ± 2.4 degrees | 180 degrees ± 4.2 degrees | 180 degrees ± 2.2 degrees |
| Example 12 | 0.878 | 0.048 | 180 degrees ± 3.2 degrees | 180 degrees ± 2.6 degrees | 180 degrees ± 4.3 degrees |
| Example 13 | 0.880 | 0.050 | 180 degrees ± 5.0 degrees | 180 degrees ± 3.1 degrees | 180 degrees ± 4.7 degrees |
| Example 14 | 0.881 | 0.048 | 180 degrees ± 3.0 degrees | 180 degrees ± 4.6 degrees | 180 degrees ± 3.2 degrees |
| Example 15 | 0.881 | 0.046 | 180 degrees ± 3.4 degrees | 180 degrees ± 4.0 degrees | 180 degrees ± 2.7 degrees |

Furthermore, in the aforementioned Examples 11 to 15, a material was suitably selected for the material of the protective film 14 that has etching resistance to dry etching gas used when patterning the phase shift films 15.

As indicated by the above results, although phase difference variation and reflectance variation of the reflective mask blanks and reflective masks in Examples 11 to 15 were larger than the values of Examples 1 to 10 at any of reflectance values of 4%, 6% and 12%, they were within tolerance. In addition, phase shift films were able to be obtained that satisfied a desired phase difference property (phase difference variation of 180 degrees±2 degrees) and desired reflectance property ($0.9 R_0 \leq R \leq 1.1 R_0$) for any of the reflectance values of 4%, 6% and 12% simply by changing film thickness and without having to change the material and composition ratio of the material of the phase shift films.

The reflective masks of Examples 11 to 15 are reflective masks having a phase shift film pattern formed thereon that has a desired phase difference property (phase difference variation of 180 degrees±2 degrees) and desired reflectance property ($0.9 R_0 \leq R \leq 1.1 R_0$). Consequently, a semiconductor device having a fine and highly accurate transfer pattern was able to be manufactured by using these reflective masks.

Examples 16 to 22

Reflective mask blanks and reflective masks were manufactured in the same manner as Example 1 with the exception of changing phase shift film 15 used in Example 1 to the materials (alloys, composition ratios) and set film thicknesses shown in Table 7 below. In addition, the refractive indices, extinction coefficients, phase difference variations and reflectance variations of the phase shift films 15 obtained by measuring in the same manner as Example 1 yielded the results shown in Tables 8-1 and 8-2.

TABLE 7

| | | | Set Film Thickness (nm) | |
|---|---|---|---|---|
| Example No. | Material | Composition Ratio | $R = 6\%$ | $R = 12\%$ |
| Example 16 | AgNb | Ag:Nb = 0.65:0.35 | 42.0 | 39.0 |
| Example 17 | PtMo | Pt:Mo = 0.60:0.40 | 36.0 | 32.0 |
| Example 18 | PtMo | Pt:Mo = 0.55:0.45 | 34.5 | 32.3 |
| Example 19 | SnRu | Sn:Ru = 0.20:0.80 | 35.3 | 32.3 |
| Example 20 | NiMo | Ni:Mo = 0.38:0.62 | 48.5 | 45.6 |
| Example 21 | CrRu | Cr:Ru = 0.70:0.30 | 42.8 | 38.5 |
| Example 22 | TiPd | Ti:Pd = 0.12:0.88 | 27.5 | 30.5 |

TABLE 8-1

| | Refractive | Extinction | Reflectance Variation | |
|---|---|---|---|---|
| Example No. | Index | Coefficient | $R = 6\%$ | $R = 12\%$ |
| Example 16 | 0.919 | 0.030 | $1.03R_0 \sim 1.07R_0$ | $0.98R_0 \sim 1.07R_0$ |
| Example 17 | 0.904 | 0.038 | $0.93R_0 \sim 1.05R_0$ | $0.95R_0 \sim 1.03R_0$ |

TABLE 8-1-continued

| Example No. | Refractive Index | Extinction Coefficient | Reflectance Variation R = 6% | Reflectance Variation R = 12% |
|---|---|---|---|---|
| Example 18 | 0.906 | 0.036 | $0.94R_0 \sim 0.99R_0$ | $0.95R_0 \sim 1.05R_0$ |
| Example 19 | 0.904 | 0.036 | $0.93R_0 \sim 0.98R_0$ | $0.98R_0 \sim 1.07R_0$ |
| Example 20 | 0.931 | 0.027 | $1.03R_0 \sim 1.04R_0$ | $0.93R_0 \sim 1.01R_0$ |
| Example 21 | 0.917 | 0.032 | $0.93R_0 \sim 1.05R_0$ | $0.98R_0 \sim 1.04R_0$ |
| Example 22 | 0.887 | 0.042 | $1.03R_0 \sim 1.10R_0$ | $0.92R_0 \sim 0.96R_0$ |

TABLE 8-2

| Example No. | Refractive Index | Extinction Coefficient | Phase Difference Variation R = 6% | Phase Difference Variation R = 12% |
|---|---|---|---|---|
| Example 16 | 0.919 | 0.030 | 180 degrees ± 3.9 degrees | 180 degrees ± 2.7 degrees |
| Example 17 | 0.904 | 0.038 | 180 degrees ± 3.2 degrees | 180 degrees ± 4.4 degrees |
| Example 18 | 0.906 | 0.036 | 180 degrees ± 2.9 degrees | 180 degrees ± 4.6 degrees |
| Example 19 | 0.904 | 0.036 | 180 degrees ± 1.7 degrees | 180 degrees ± 2.3 degrees |
| Example 20 | 0.931 | 0.027 | 180 degrees ± 2.9 degrees | 180 degrees ± 4.4 degrees |
| Example 21 | 0.917 | 0.032 | 180 degrees ± 4.5 degrees | 180 degrees ± 2.8 degrees |
| Example 22 | 0.887 | 0.042 | 180 degrees ± 3.5 degrees | 180 degrees ± 2.2 degrees |

Furthermore, in the aforementioned Examples 16 to 22, a material was suitably selected for the material of the protective film 14 that has etching resistance to dry etching gas used when patterning the phase shift films 15.

As indicated by the above results, although phase difference variation and reflectance variation of the reflective mask blanks and reflective masks in Examples 16 to 22 were larger than the values of Examples 1 to 10 at reflectance values of 6% and 12%, they were within tolerance. In addition, phase shift films were able to be obtained that satisfied a desired phase difference property (phase difference variation of 180 degrees±5 degrees) and desired reflectance property (0.9 $R_0 \leq R \leq 1.1\ R_0$) for either of the reflectance values of 6% and 12% simply by changing film thickness and without having to change the material and composition ratio of the material of the phase shift films.

The reflective masks of Examples 16 to 22 are reflective masks having a phase shift film pattern formed thereon that has a desired phase difference property (phase difference variation of 180 degrees±5 degrees) and desired reflectance property (0.9 $R_0 \leq R \leq 1.1\ R_0$). Consequently, a semiconductor device having a fine and highly accurate transfer pattern was able to be manufactured by using these reflective masks.

Comparative Examples 1 to 3

A reflective mask blank having the property of reflectance of the phase shift film of 6% as Comparative Example 1, a reflective mask blank having the property of reflectance of the phase shift film of 4% as Comparative Example 2, and a reflective mask blank having the property of reflectance of the phase shift film of 12% as Comparative Example 3 were manufactured, respectively.

Reflective mask blanks and reflective masks were manufactured in the same manner as Example 1 with the exception of changing the phase shift film used in the aforementioned Example 1 to the materials (alloys, composition ratios) and set film thicknesses shown in the following Table 9. In addition, the refractive indices, extinction coefficients, phase difference variations and reflectance variations of the phase shift films 15 obtained by measuring in the same manner as Example 1 yielded the results shown in Table 10.

TABLE 9

| Comparative Example No. | Material | Composition Ratio | Set Film Thickness (nm) |
|---|---|---|---|
| Comparative Example 1 | TaMo | Ta:Mo = 0.67:0.33 | 52.2 |
| Comparative Example 2 | TaRu | Ta:Ru = 0.68:0.32 | 50.3 |
| Comparative Example 3 | TaRu | Ta:Ru = 0.55:0.45 | 38.8 |

TABLE 10

| Comparative Example No. | Refractive Index | Extinction Coefficient | Phase Difference Variation | Reflectance Variation |
|---|---|---|---|---|
| Comparative Example 1 | 0.937 | 0.031 | 180 degrees ± 7.8 degrees | $0.98R_0 \sim 1.09R_0$ ($R_0$ = 6%) |
| Comparative Example 2 | 0.928 | 0.035 | 180 degrees ± 5.6 degrees | $0.88R_0 \sim 1.04R_0$ ($R_0$ = 4%) |
| Comparative Example 3 | 0.921 | 0.032 | 180 degrees ± 6.7 degrees | $0.88R_0 \sim 0.96R_0$ ($R_0$ = 12%) |

As indicated by the above results, although reflectance variation of the reflective mask blanks and reflective masks of Comparative Examples 1 to 3 were within the range of 0.9 $R_0 \leq R \leq 1.1\ R_0$, phase difference variation exceeded the range of ±5 degrees.

The reflective masks of Comparative Examples 1 to 3 are reflective masks having a phase shift film pattern formed thereon that does not satisfy a desired phase difference property (phase difference variation of 180 degrees±5 degrees) and desired reflectance property (reflectance variation of 0.9 $R_0 \leq R \leq 1.1\ R_0$). Consequently, a semiconductor device having a fine and highly accurate transfer pattern was unable to be manufactured by using these reflective masks.

Moreover, although a semiconductor device was manufactured by transferring the resist pattern to a processed film by etching and further going through various steps such as forming an insulating film or conductive film, introducing a dopant or subjecting to annealing, a semiconductor device having desired properties was unable to be manufactured at high yield.

Reference Examples 1 and 2

Reflective mask blanks and reflective masks of Reference Examples 1 and 2 were manufactured in the same manner as Example 1 with the exception of changing the phase shift film 15 used in Example 1 to the materials (alloys, composition ratios) and set film thicknesses shown in the following Table 11. In addition, the refractive indices, extinction coefficients, phase difference variations and reflectance variations of the phase shift films 15 obtained by measuring in the same manner as Example 1 yielded the results shown in Tables 12-1 and 12-2.

TABLE 11

| Reference Example No. | Composition | | Set Film Thickness (nm) | | |
|---|---|---|---|---|---|
| | Material | Ratio | $R_0 = 4\%$ | $R_0 = 6\%$ | $R_0 = 12\%$ |
| Reference Example 1 | CrMo | Cr:Mo = 0.90:0.10 | 50.2 | 45.6 | 31.6 |
| Reference Example 2 | TaMo | Ta:Mo = 0.82:0.18 | 52.2 | 45.1 | 31.3 |

TABLE 12-1

| Reference Example No. | Refractive Index | Extinction Coefficient | Reflectance Variation | | |
|---|---|---|---|---|---|
| | | | $R_0 = 4\%$ | $R_0 = 6\%$ | $R_0 = 12\%$ |
| Reference Example 1 | 0.931 | 0.035 | $0.92R_0\sim 1.07R_0$ | $0.93R_0\sim 1.06R_0$ | $0.96R_0\sim 1.04R_0$ |
| Reference Example 2 | 0.940 | 0.035 | $0.92R_0\sim 1.07R_0$ | $0.94R_0\sim 1.06R_0$ | $0.96R_0\sim 1.04R_0$ |

TABLE 12-2

| Reference Example No. | Refractive Index | Extinction Coefficient | Phase Difference Variation | | |
|---|---|---|---|---|---|
| | | | $R_0 = 4\%$ | $R_0 = 6\%$ | $R_0 = 12\%$ |
| Reference Example 1 | 0.931 | 0.035 | 180 degrees ± 6.4 degrees | 180 degrees ± 3.4 degrees | 180 degrees ± 52.7 degrees |
| Reference Example 2 | 0.940 | 0.035 | 180 degrees ± 3.7 degrees | 180 degrees ± 26.5 degrees | 180 degrees ± 70.1 degrees |

As indicated by the above results, reflectance variation of the reflective mask blank and reflective mask of Reference Example 1 was within the range of $0.9\ R_0 \le R \le 1.1\ R_0$ and phase difference variation was within the range of ±5 degrees in the case of reflectance of 6%. However, phase difference variation in Reference Example 1 exceeded the range of ±5 degrees in cases of reflectance of 4% and 12%. In addition, in Reference Example 2, reflectance variation was within the range of $0.9\ R_0 \le R \le 1.1\ R_0$ and phase difference variation was within the range of ±5 degrees in the case of reflectance of 4%. However, phase difference variation in Reference Example 1 exceeded the range of ±5 degrees in cases of reflectance of 6% and 12%. Thus, phase shift films were unable to be obtained in Reference Examples 1 and 2 that satisfied a desired phase difference property (phase difference variation of 180 degrees±5 degrees) and desired reflectance property ($0.9\ R_0 \le R \le 1.1\ R_0$) in cases of reflectance values of 4%, 6% and 12% by simply changing film thickness without having to change the material and composition ratio of the phase shift film.

BRIEF DESCRIPTION OF THE REFERENCE SYMBOLS

10 Reflective mask blank
11 Back side conductive film
12 Substrate
13 Multilayer reflective film
14 Protective film
15 Phase shift film

The invention claimed is:

1. A reflective mask blank comprising:
a substrate;
a multilayer reflective film formed on the substrate; and
a phase shift film formed on the multilayer reflective film,
wherein the phase shift film comprises an alloy having at least two metal elements, the at least two metal elements including at least one metal element from a Group A and at least one metal element from a Group B, and
wherein the metal elements in the Group A are Pd, Ag, Pt, Au, Ir, W, Cr, Mn, Sn, Ta, V, Fe and Hf, and
wherein the metal elements in the Group B are Rh, Ru, Mo, Nb, Zr and Y.

2. The reflective mask blank according to claim 1, wherein the alloy comprises MoTa alloy, and a composition ratio of Mo is larger than a composition ratio of Ta in the alloy.

3. The reflective mask blank according to claim 1, wherein the alloy comprises PdRu alloy, PdMo alloy, PdNb alloy or PdZr alloy.

4. The reflective mask blank according to claim 1, wherein the alloy comprises CrRu alloy.

5. The reflective mask blank according to claim 1, wherein the alloy comprises at least three metal elements.

6. The reflective mask blank according to claim 1, wherein the phase shift film further comprises at least one selected from oxygen, nitrogen, carbon and boron.

7. The reflective mask blank according to claim 1, wherein a reflectance R, to EUV light, of a surface of the phase shift film is more than 10% and not more than 20%.

8. The reflective mask blank according to claim 1, wherein the film thickness of the phase shift film is 25 nm to 70 nm.

9. The reflective mask blank according to claim 1, wherein a layer of the multilayer reflective film that is closest to the phase shift film is a protective film.

10. A reflective mask comprising a phase shift film pattern obtained by patterning the phase shift film in the reflective mask blank according to claim 1.

11. A method of manufacturing a semiconductor device comprising forming a pattern on a semiconductor substrate using the reflective mask according to claim 10.

12. A reflective mask blank comprising:
a substrate;
a multilayer reflective film formed on the substrate; and
a phase shift film formed on the multilayer reflective film,
wherein the phase shift film comprises an alloy having at least two metal elements, the at least two metal elements including at least one metal element from a Group A and at least one metal element from a Group B, and
wherein the metal elements in the Group A are Rh, Pd, Ag, Pt, Au, Ir, W, Cr, Mn, Sn, V, Fe and Hf, and
wherein the metal elements in the Group B are Ru, Mo, Nb, Zr and Y.

13. The reflective mask blank according to claim 12, wherein the alloy comprises PdRu alloy, PdMo alloy, PdNb alloy or PdZr alloy.

14. The reflective mask blank according to claim 12, wherein the alloy comprises CrRu alloy.

15. The reflective mask blank according to claim 12, wherein the alloy comprises at least three metal elements.

16. The reflective mask blank according to claim 12, wherein the phase shift film further comprises at least one selected from oxygen, nitrogen, carbon and boron.

17. The reflective mask blank according to claim 12, wherein a reflectance R, to EUV light, of a surface of the phase shift film is more than 10% and not more than 20%.

18. The reflective mask blank according to claim 12, wherein the film thickness of the phase shift film is 25 nm to 70 nm.

19. The reflective mask blank according to claim 12, wherein a layer of the multilayer reflective film that is closest to the phase shift film is a protective film.

20. A reflective mask comprising a phase shift film pattern obtained by patterning the phase shift film in the reflective mask blank according to claim 12.

21. A method of manufacturing a semiconductor device comprising forming a pattern on a semiconductor substrate using the reflective mask according to claim 20.

* * * * *